(12) United States Patent
Abramovici et al.

(10) Patent No.: US 7,017,096 B2
(45) Date of Patent: Mar. 21, 2006

(54) SEQUENTIAL TEST PATTERN GENERATION USING CLOCK-CONTROL DESIGN FOR TESTABILITY STRUCTURES

(75) Inventors: Miron Abramovici, Berkeley Heights, NJ (US); Xiaoming Yu, Champaign, IL (US)

(73) Assignee: Agere Systems Inc., Allentown, PA (US)

( * ) Notice: Subject to any disclaimer, the term of this patent is extended or adjusted under 35 U.S.C. 154(b) by 490 days.

(21) Appl. No.: 10/106,960

(22) Filed: Mar. 26, 2002

(65) Prior Publication Data

US 2003/0188245 A1    Oct. 2, 2003

(51) Int. Cl.
*G06F 11/00*    (2006.01)
*G01R 31/28*    (2006.01)

(52) U.S. Cl. ..................... 714/738; 714/726
(58) Field of Classification Search ............... 714/744, 714/724, 733, 726, 738, 742, 728; 327/291; 377/29; 340/506
See application file for complete search history.

(56) References Cited

U.S. PATENT DOCUMENTS

| | | | | |
|---|---|---|---|---|
| 3,812,337 | A | * | 5/1974 | Crosley ..................... 714/811 |
| 4,331,952 | A | * | 5/1982 | Galvin et al. ............... 340/508 |
| 5,519,713 | A | * | 5/1996 | Baeg et al. .................. 714/724 |
| 5,559,811 | A | | 9/1996 | Abramovici et al. |
| 5,566,187 | A | | 10/1996 | Abramovici et al. |
| 5,590,135 | A | | 12/1996 | Abramovici et al. |
| 5,625,630 | A | | 4/1997 | Abramovici et al. |
| 5,805,608 | A | * | 9/1998 | Baeg et al. .................. 714/726 |
| 6,515,530 | B1 | * | 2/2003 | Boerstler et al. ........... 327/291 |
| 6,691,266 | B1 | * | 2/2004 | Winegarden et al. ....... 714/724 |
| 6,728,917 | B1 | * | 4/2004 | Abramovici et al. ........ 714/744 |

OTHER PUBLICATIONS

J. Shin et al., "At-Speed Logic BIST Using a Frozen Clock Testing Strategy," Proceedings International Test Conference (ITC), Paper 3.2, pp. 64-71, 2001.
U.S. Appl. No. 09/780,861, filed Feb. 9, 2001, M. Abramovici et al., "Sequential Test Pattern Generation Using Combinational Techniques.".
Y. Bertrand et al., "Multiconfiguration Technique to Reduce Test Duration for Sequential Circuits," International Test Conference, pp. 989-997, 1993.
M. Abramovici et al., "SMART and Fast: Test Generation for VLSI Scan-Design Circuits," IEEE Design & Test, pp. 43-54, 1986.
1. M. Abramovici et al., "FREEZE!: A New Approach for Testing Sequential Circuits," Proc. 29th Design Automation Conf., pp. Jun. 22-25, 1992.
Y. Santoso et al., "FreezeFrame: Compact Test Generation Using a Frozen Clock Strategy," Proc. Design Automation and Test in Europe Conf., 6 pages, Mar. 1999.
V. D. Agrawal et al., "Design for Testability and Test Generation with Two Clocks," Proc. 4th Int'l. Symp. on VLSI Design, pp. 112-117, Jan. 1991.

(Continued)

*Primary Examiner*—Shelly Chase
*Assistant Examiner*—Mujtaba Chaudry

(57) ABSTRACT

Techniques for testing a sequential circuit comprising a plurality of flip-flops or other types of registers. The circuit is first configured such that substantially all feedback loops associated with the registers, other than one or more self-loops each associated with a corresponding one of the registers, are broken. Test patterns are then generated for application to the circuit. The test patterns are applied to the circuit in conjunction with partitioned clock signals each of which is associated with a corresponding level of the circuit containing at least one of the self-loops.

21 Claims, 7 Drawing Sheets

OTHER PUBLICATIONS

K.L. Einspahr et al., "Clock Partitioning for Testability," Proc. 3rd IEEE Great Lakes Symp. on VLSI, pp. 42-46, Mar. 1993.

K.L. Einspahr et al., "Improving Circuit Testability by Clock Control," Proc. 6th IEEE Great Lakes Symposium on VLSI, pp. 288-293, Mar. 1996.

K.L. Einspahr et al., "A Synthesis for Testability Scheme for Finite State Machines Using Clock Control," IEEE Transactions on CAD, vol. 18, No. 12, pp. 1780-1792, Dec. 1999.

S.H. Baeg et al., "A New Design for Testability Method: Clock Line Control Design," Proc. Custom Integrated Circuits Conf., pp. 26.2.1-26.2.4, 1993.

K.B. Rajan et al., "Increasing Testability by Clock Transformation (Getting Rid of Those Darn States)," Proc. VLSI Test Symp., pp. 1-7, Apr. 1996.

R. Gupta et al., "The Ballast Methodology for Structured Partial Scan Design," IEEE Trans. on Computers, vol. 39, No. 4, pp. 538-544, Apr. 1990.

T.M. Niermann et al., "PROOFS: A Fast, Memory-Efficient Sequential Circuit Fault Simulator," IEEE Trans. CAD, vol. 11, No. 2, pp. 198-207, Feb. 1992.

T.P. Kelsey et al., "An Efficient Algorithm for Sequential Circuit Test Generation," IEEE Trans. on Computers, vol. 42, No. 11, pp. 1361-1371, Nov. 1993.

M.A. Iyer et al., "Identifying Sequential Redundancies Without Search," Proc. 33rd Design Automation Conf., pp. 457-462, Jun. 1996.

D.E. Long et al., "FILL and FUNI: Algorithms to Identify Illegal States and Sequentially Untestable Faults," ACM Trans. on Design Automation of Electronic Systems, 27 pages, Jul. 2000.

I. Hamzaoglu et al.,"New Techniques for Deterministic Test Pattern Generation," Proc. VLSI Test Symp, pp. 446-452, 15 pages, Apr. 1998.

* cited by examiner

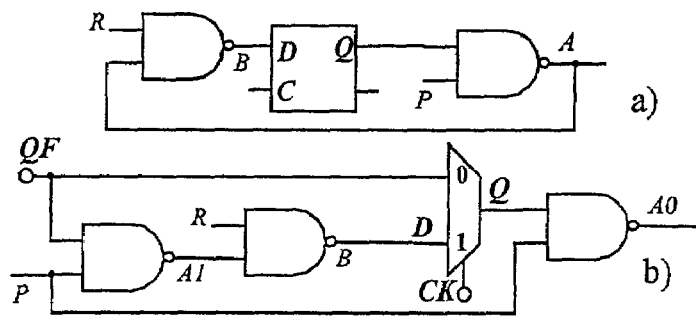
FIG. 6
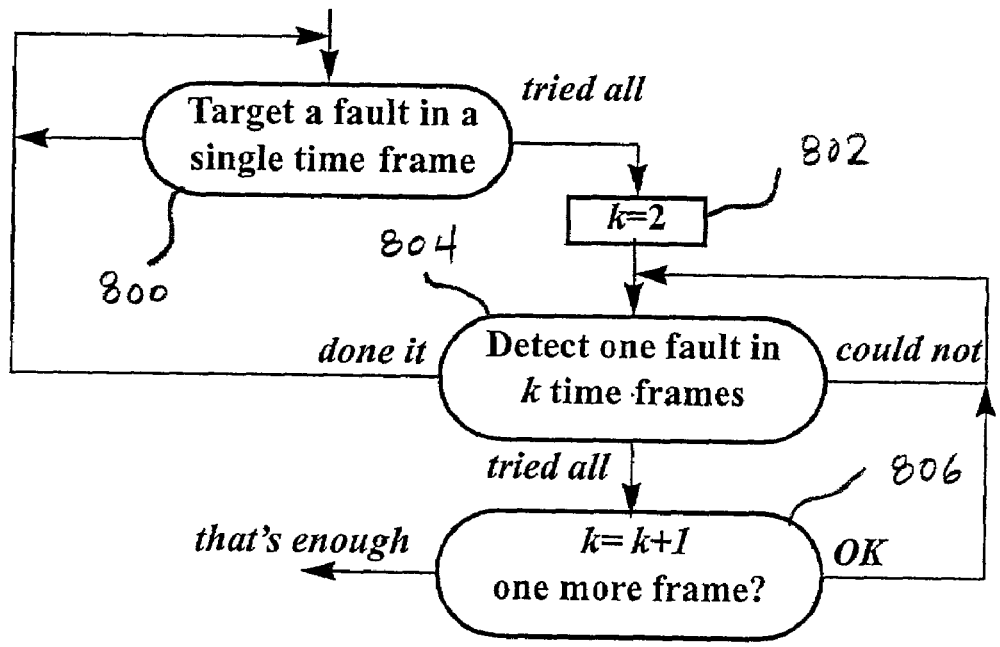
FIG. 7
FIG. 8

SEQUENTIAL TEST PATTERN GENERATION USING CLOCK-CONTROL DESIGN FOR TESTABILITY STRUCTURES

FIELD OF THE INVENTION

The present invention relates generally to the design and testing of integrated circuits and other complex electronic circuits, and more particularly to techniques for generating test patterns for use in testing such circuits.

BACKGROUND OF THE INVENTION

Automatic test pattern generation (ATPG) for sequential circuits is an extremely expensive computational process. ATPG algorithms working on complex sequential circuits can spend many hours of central processing unit (CPU) time and still obtain poor results in terms of fault coverage. There are a number of factors that contribute to the difficulty of the ATPG process for sequential circuits. For example, it is generally necessary for an ATPG algorithm to use a model that includes an iterative array of time frames, where the number of time frames may be, in the worst case, an exponential function of the number of flip-flops (FFs) in the circuit. In addition, an ATPG algorithm may waste a substantial amount of time trying to justify illegal states. Furthermore, an ATPG algorithm typically must complete an exhaustive search for each target fault that is to be identified as untestable. Another difficulty is controlling and observing so-called "buried" FFs of the sequential circuit.

Because of the above-noted difficulties associated with sequential ATPG, complex sequential circuits are generally tested using design for testability (DFT) techniques, such as scan design, which significantly change the structure of a given circuit so as to make its buried FFs more controllable and observable in test mode. However, scan-type DFT techniques introduce delay penalties that result in performance degradation, and substantially increase circuit area overhead thereby increasing power consumption and decreasing yield. In addition, scan-type DFT techniques are not directly compatible with at-speed testing.

U.S. patent application Ser. No. 09/780,861, filed Feb. 9, 2001 and entitled "Sequential Test Pattern Generation Using Combinational Techniques," which is incorporated by reference herein, describes techniques for performing ATPG for sequential circuits in a more efficient manner, so as to alleviate the problems associated with conventional ATPG, while also avoiding the problems associated with existing DFT techniques such as scan design.

Despite the considerable advancements provided by the techniques described in the above-cited U.S. patent application, a need remains for further improvements in the testing of sequential circuits using ATPG.

SUMMARY OF THE INVENTION

In accordance with one aspect of the invention, test pattern generation is performed for a sequential circuit comprising a plurality of flip-flops or other types of registers. The circuit is first configured such that substantially all feedback loops associated with the registers, other than one or more self-loops each associated with a corresponding one of the registers, are broken. Test patterns are then generated for application to the circuit. The test patterns are applied to the circuit in conjunction with partitioned clock signals each of which is associated with a corresponding portion of the circuit containing at least one of the self-loops.

By way of example, the feedback loops of the circuit may include global loops, each comprising two or more registers, and self-loops, each comprising a single register. In this case, all of the global loops may be broken, with a given one of the global loops being broken by temporarily freezing a clock signal associated with at least one register in the given global loop. As another example, the sequential circuit may already be configured such that the feedback loops of the circuit include only self-loops, each comprising a single register. In this case, configuring the circuit for testing need not involve the breaking of any feedback loops of the circuit.

In an illustrative embodiment, a design for testability (DFT) structure is used to provide partitioning of a master clock into multiple clock signals each associated with a corresponding one of the levels of self-loops, so as to permit breaking of the feedback loops other than the self-loops. The registers of the circuit may be arranged in the particular levels by assigning a first one of the levels to each register which is fed only by primary inputs (PIs) of the circuit, and then assigning to level i +1 every register that is fed by other registers whose maximum level is i, where i =1, 2, . . . d, and d is the sequential depth of the circuit. The partitioned clock signals may be generated by the DFT structure such that all registers at the same level have associated therewith a corresponding independently controllable clock signal. The partitioned clock signals are preferably applied to the levels in the form of a "clock wave," which illustratively may be a clocking sequence comprising a plurality of clock pulses, with a first one of the clock pulses being applied to a first one of the levels, then a second one of the clock pulses being applied to a second one of the levels, and so on until a final one of the clock pulses is applied to a final one of the levels, such that a given one of the applied test patterns propagates through the circuit. A given applied test pattern is preferably kept constant for d 1 clock cycles, with cycle d +1 being used to allow changes in level-d registers to propagate to primary outputs of the circuit.

In accordance with another aspect of the invention, each of the levels of registers may have multiple groups of registers associated therewith, with each of the groups being subject to clocking by one of the partitioned clock signals through the operation of group selection circuitry. The DFT structure in this case may include level selection circuitry and group selection circuitry, with the level selection circuitry configured for selecting a particular one of the levels for receiving a corresponding one of the clock signals, and the group selection circuitry configured for selecting a particular group of registers within a given one of the levels for receiving a corresponding one of the clock signals. The group selection circuitry thus allows further partitioning of the registers of the circuit within a given level. The group selection circuitry of the DFT structure may be implemented using G additional primary inputs of the circuit, where G is the maximum number of groups at any level, or by using a plurality of additional registers $EG_{ij}$, each of the registers $EG_{ij}$ storing an enable value for a corresponding group j at level i.

An ATPG process in accordance with a further aspect of the invention includes a first processing step which detects target faults in a single time frame, and a second processing step which detects target faults in two or more time frames. After targeting all potentially detectable faults in the single time frame via the first processing step, the process in the second processing step targets all potentially detectable faults in k time frames, where k is initially set to a value of two for a first iteration of the second processing step. The value of k is incremented for a subsequent iteration of the second processing step only when no faults are detected in the previous iteration of the second processing step.

Advantageously, the test pattern generation process of the present invention addresses the above-described problems associated with conventional testing of sequential circuits without requiring a scan-type DFT approach that significantly changes the circuit configuration in test mode. The DFT structures utilized in the illustrative embodiments introduce no delay penalties and only a small area overhead, and are compatible with at-speed testing.

DETAILED DESCRIPTION OF THE INVENTION

The present invention will be illustrated herein using exemplary sequential circuits. It should be understood, however, that the techniques of the invention can be applied to any desired type of sequential circuit. The term "register" as used herein is intended to include any arrangement of one or more flip-flops (FFs) or other circuit storage elements. The term "freezing" as used herein in conjunction with a clock signal refers to any technique for interrupting or otherwise stopping the clock signal.

The present invention provides improved techniques for performing automatic test pattern generation (ATPG) that are particularly well-suited for use with sequential circuits. More particularly, the invention in the illustrative embodiments to be described provides improved design for testability (DFT) structures and a corresponding ATPG process. Advantageously, the DFT structures of the present invention do not introduce any significant delay penalty, have a very small area overhead and are compatible with at-speed testing. The corresponding ATPG process operates in conjunction with the DFT structures of the invention to provide improved testing of sequential circuits.

In a sequential circuit, a given feedback loop may be local or global. A local loop includes only one FF and is also called a self-loop. Any loop with two or more FFs is called a global loop. A pipeline is a loop-free or acyclic sequential circuit.

The present invention in the illustrative embodiments uses the above-noted clock-control DFT structures to temporarily freeze a subset of sequential circuit FFs so as to break all global loops. This creates a near-acyclic circuit in which every FF is either feedback-free or has a self-loop. This near-acyclic circuit is referred to herein as a "loopy pipe," since it has a pipeline structure if the self-loops are ignored. Because loopy pipes do not have global feedback, they are structurally simpler than sequential circuits with both local and global feedback. Conventional ATPG techniques are generally not well-suited for use with sequential circuits that are configurable as loopy pipes. The present invention, however, provides ATPG techniques that can handle loopy pipes in a particularly efficient manner. For example, the invention uses clock-control DFT structures to generate what are referred to herein as "clock waves." A clock wave is a novel clocking technique that allows a loopy pipe to be tested as a pipeline, such that efficient combinational ATPG techniques may be used in testing a sequential circuit. It has been shown, for example, in R. Gupta et al., "The Ballast Methodology for Structured Partial Scan Design," IEEE Trans. on Computers, Vol. 39, No. 4, pp. 538–544, Apr. 1990, that test generation in a pipeline circuit can be done by combinational techniques.

Figure 1:
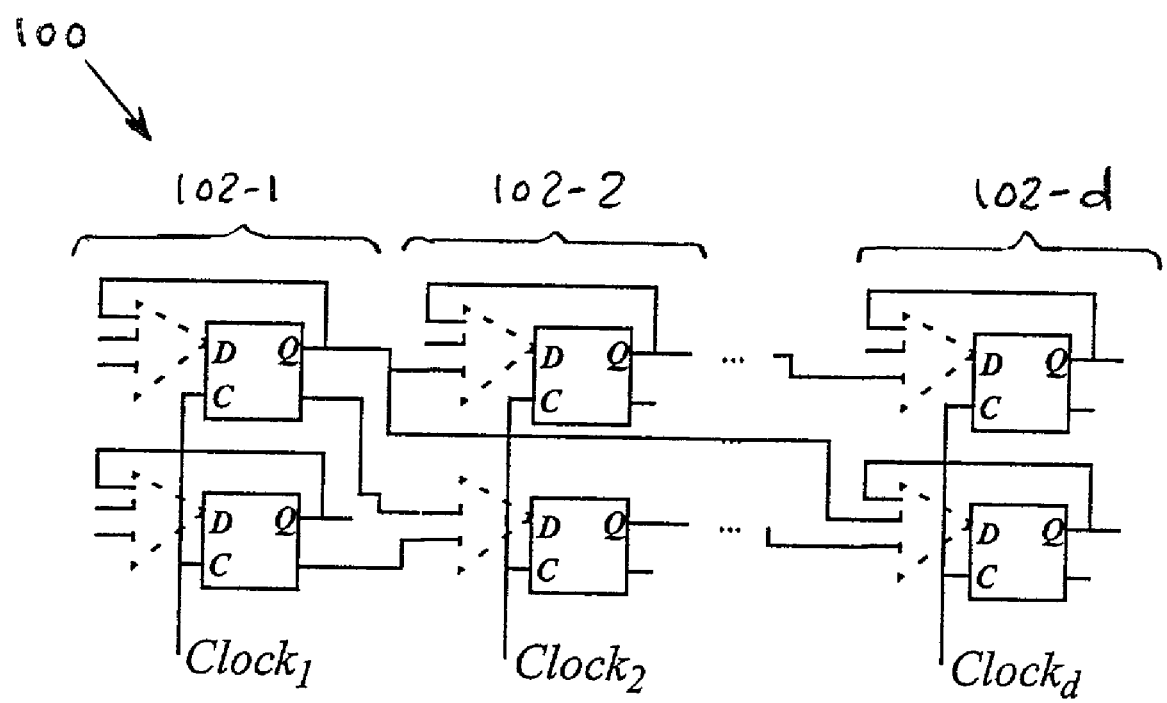
FIG. 1 shows a portion of a sequential circuit configured as a loopy pipe with partitioned clocks in accordance with the techniques of the invention.

FIG. 1 shows a portion of a sequential circuit 100 configured as a loopy pipe with partitioned clocks in accordance with the techniques of the invention. The portion of the sequential circuit 100 shown in the figure includes d groups of D-type FFs denoted 102-1, 102-2, . . . 102-d, with each of the FFs in a given group being clocked by a corresponding clock signal $Clock_1$, $Clock_2$, . . . $Clock_d$. It should be appreciated that the FIG. 1 circuit is simplified for illustrative purposes, and that the circuit may include other logic circuitry not explicitly shown. The loopy pipe is configured by first building for each of the FFs its corresponding "data cone" comprising all of the logic circuitry feeding its D input. The data cone may be built by tracing back from the D input of a given FF and stopping at primary inputs (PIs) and FF outputs. The data cones are shown illustratively as dashed triangles at the D inputs of the FFs in FIG. 1.

Since a loopy pipe has no global feedback, it is possible to arrange the FFs in levels if the self-loops are ignored. In this example, level 1 is assigned to every FF fed only by PIs, and every FF fed by FFs whose maximum level is i is assigned level i+1. The highest level d is the sequential depth of the loopy pipe. The DFT structures to be described below in conjunction with FIGS. 2A and 2B provide clock partitioning such that all FFs at the same level i have a corresponding independent clock $Clock_i$ as in the FIG. 1 loopy pipe example.

In the illustrative embodiments, a loopy pipe such as that shown in FIG. 1 is tested by keeping a given applied PI vector constant while applying the above-noted clock wave to the partitioned clocks. The clock wave in these embodiments is in the form of a sequence that applies a pulse to $Clock_1$, then to $Clock_2, \ldots$, and eventually to $Clock_d$. In this way the applied PI vector propagates throughout the circuit, with every FF being clocked only once. The applied PI vector is preferably kept constant for d+1 clock cycles, with cycle d+1 being used to allow the changes in the level-d FFs to propagate to primary outputs (POs).

Figure 2A:
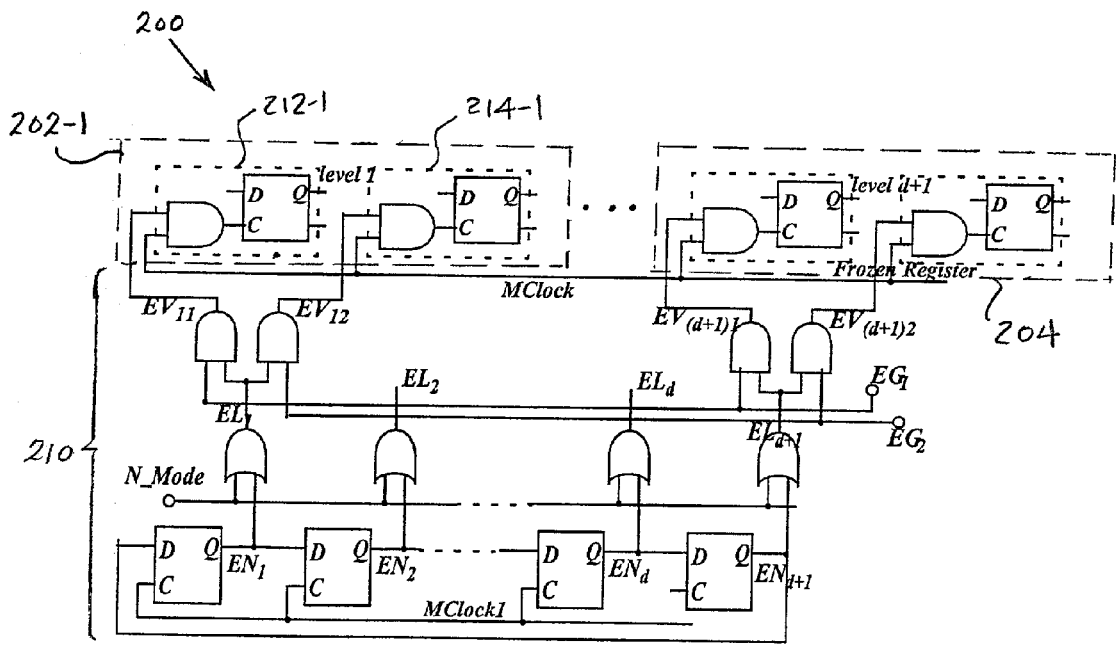
FIGS. 2A and 2B show example clock-control design for testability (DFT) structures in accordance with illustrative embodiments of the invention.
Figure 2B:
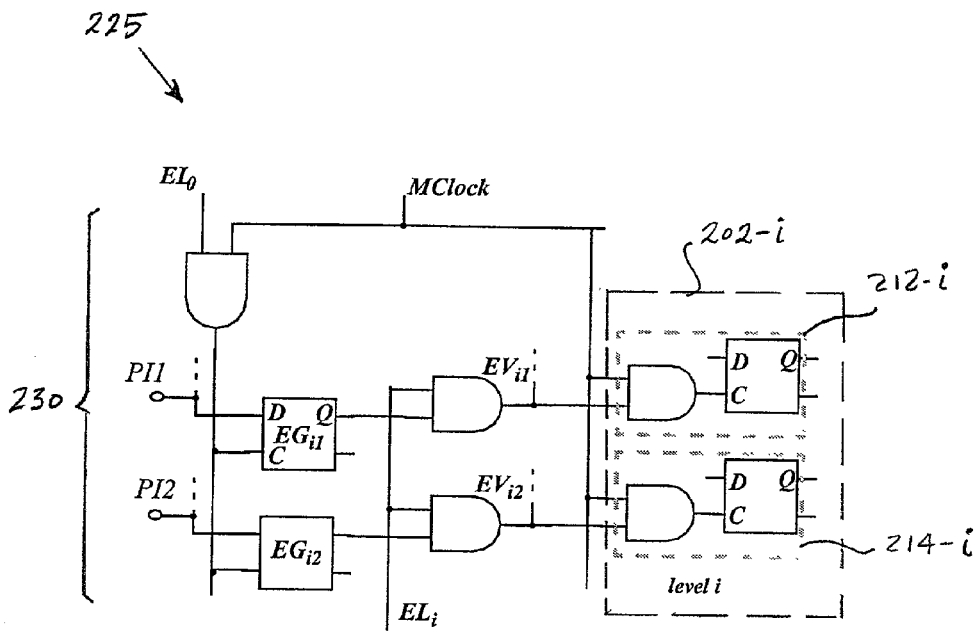

FIG. 2A shows an example clock-control DFT structure that may be utilized in conjunction with a loopy pipe with d levels embedded in a sequential circuit 200. The loopy pipe includes level 1 through level d FF circuits denoted 202-1 through 202-d, although of these only the circuit 202-1 is explicitly shown. The circuit 200 further includes a frozen register 204, which in this example is treated as an additional FF circuit at level d+1. The DFT structure in this example comprises logic circuitry 210 in conjunction with clock-enabling AND gates in the FF circuits 202 and in the frozen register 204.

Assume initially that PIs $EG_1$ and $EG_2$ are configured such that $EG_1=EG_2=1$. All the FFs at level i are enabled by the same enable level signal $EL_i$. In normal mode, N_Mode=1, so that all $EL_i$ signals are active, and the main clock Mclock propagates to all FFs. In test mode, N_Mode=0, and the clock propagation is under the control of d+1 enabling signals $EN_i$, generated by a circular shift register with d+1 FFs in logic circuitry 210. The initial state in the circular shift register is 10 . . . 0, so that one level at a time will be enabled in the proper sequence. The shift register is clocked by a different phase of the main clock, i.e., a clock signal denoted MClock1. An enable group j signal $EG_j$ allows further clock partitioning of the FFs at the same level i. The enable value for group j at level i is $EV_{ij}=EL_i*EG_j$. The timing of MClock1 is determined so that the EV values will be stable before the arrival of the next MClock pulse.

The FIG. 2A clock-control DFT structure includes two groups at each level, with only one FF being shown in each group. For example, FF circuit 202-1 includes a first group 212-1 and a second group 214-1. While normal PIs of the circuit 200 are kept constant for d+1 clock cycles, the $EG_j$ signals may change before every clock pulse. The $EG_j$ signals can thus be shared among all levels, because the levels are clocked one by one. Hence, in every cycle the $EG_j$ signals determine the clock partition for a different level. In normal mode, all $EG_j$ signals are always set to 1. The same mechanism is used to hold the state of the frozen register 204 for several clock waves, by setting all $EG_j$ signals to 0 in the d+1 cycle. Note that even when the frozen state is not changed, cycle d+1 is used to observe POs.

Although it is possible to reduce the hardware requirements in the clock-control DFT structure of FIG. 2A by having only one AND gating MClock for all the FFs in the same group, such an arrangement may result in clock skewing. By having clock gating within every FF as shown in FIG. 2A, the clock distribution path to the FFs, i.e., the routing of MClock, is the same in both the normal mode and in the test mode, such that the DFT structure will not cause clock skewing.

It is apparent from the foregoing description that the clock-control DFT structure of FIG. 2A requires G additional PIs, where G is the maximum number of groups needed at any level. However, there may be circuit applications in which G spare PIs are not available. For these and other applications, the DFT structure of FIG. 2B may be preferred.

FIG. 2B shows an alternative clock-control DFT structure for implementation in a sequential circuit 225 in accordance with the invention. The DFT structure in this example comprises logic circuitry 230 in conjunction with clock-enabling AND gates in each of the d+1 levels, e.g., the FF circuits 202 and in the frozen register 204. Only one FF circuit 202-i, i=1, 2, . . . d+1, is explicitly shown, but it is assumed that the FF circuits are arranged as in FIG. 2A, and include frozen register 204. Each FF circuit 202-i and the frozen register 204 is assumed in this example to include corresponding first and second groups 212-i and 214-i, respectively.

This DFT structure needs no additional PIs but requires additional FFs $EG_{ij}$ to store the enable values for every group j at every level i. These additional FFs must be set before a given clock wave starts, so they are treated as an additional level 0, which may be obtained by adding another FF, e.g., a FF denoted $EN_0$ to the circular shift register of FIG. 2A. Data values for the $EG_{ij}$ FFs may be supplied by "normal" or regular PIs. This is possible because MClock does not reach any functional FF when the level-0 FFs are enabled. The DFT structure of FIG. 2B can provide a large number of enabling signals without additional PIs. In the normal mode, the $EG_{ij}$ FFs are always set to 1.

Figure 3:
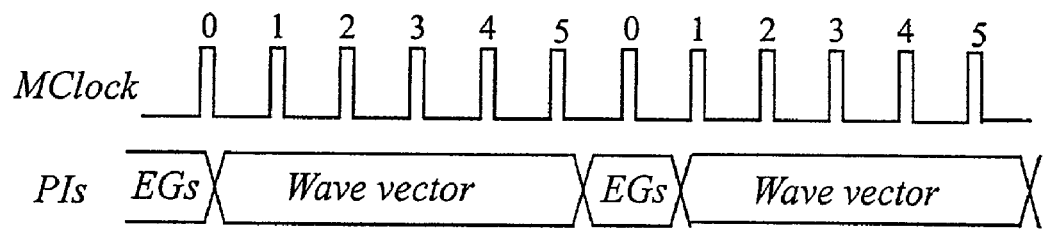
FIG. 3 is a timing diagram for the FIG. 2B clock-control DFT structure for an example loopy pipe with a sequential depth of d=4.

FIG. 3 is a timing diagram illustrating the relation between MClock cycles and the PIs, for a sequential circuit having a frozen register and a loopy pipe with d=4, using the DFT structure of FIG. 2B. Each applied PI vector is held for cycles 1 to 5. MCLOCK pulse 0 loads the $EG_{ij}$ FFs, and MCLOCK pulse 5 is for the frozen register 204. The POs are observed after MCLOCK pulse 4. In addition to the increase in testability caused by reducing the correlation among FFs sharing the same clock, the second level of clock partitioning described above provides a dynamic freeze capability. This dynamic freeze capability allows an automatic test pattern generator to hold the state of a given FF as long as it needs to, by simply not clocking it. This is especially useful when different fault effects have been propagated to that FF.

For a circuit with n FFs in the FF circuits 202 and 204, the main component of the area overhead associated with the DFT structures of FIGS. 2A and 2B is the n clock-enabling AND gates, but this area overhead is significantly less than the area overhead typically associated with a conventional scan design. In addition, there are d+1 FFs and d+1 OR gates used for generation of the above-described clock wave. If $G_i$ is the number of clock groups at level i, then for the DFT structure of FIG. 2A, G=max$\{G_i\}$PIs are needed, while for the DFT structure of FIG. 2B, $G_i$ FFs and $G_i$ AND gates are needed at every level i. However, the total number of FFs and other gates required for clock control is generally much smaller than n, so the total area overhead will still be substantially less than that required for scan design.

An important advantage of the DFT structures of FIGS. 2A and 2B is that the operating frequency of the sequential circuit is not affected by the clock control mechanism, since no delays are introduced in data paths. Unlike scan design, the above-described clock-control DFT structures are fully compatible with at-speed testing. Compared to scan-based tests, tests implemented using the techniques of the present invention generally have much shorter test application times and consume much less power, because scan operations are not performed, and only a subset of the FFs are concurrently clocked.

Figure 4:
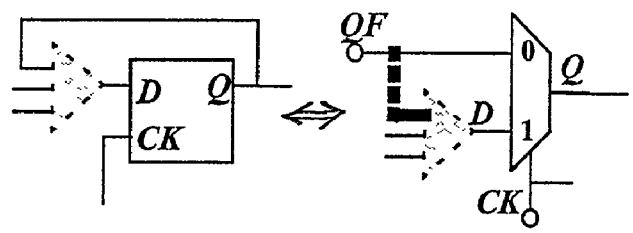
FIG. 4 shows a model for an example self-loop flip-flop in accordance with the invention.

FIG. 4 shows a combinational model of a self-loop FF, suitable for use in conjunction with the invention. The left side of the figure shows a given one of the self-loop FFs from the loopy pipe of FIG. 1. The right side shows a corresponding model to be utilized in the ATPG process of the invention. In the model, the clock is treated as a regular PI: CK=1 denotes the application of a clock pulse that transfers the D input into the new state Q, while CK=0 means that a clock pulse is not applied, so the FF holds its previous state QF, represented by an additional PI. Note that QF may also influence Q through the data cone, again illustrated as a dashed triangle at the D input, reflecting the effect of the feedback loop.

In the FIG. 4 model, QF is modeled as a frozen PI, so that the ATPG process to be described below will not be allowed to change its value. If the process starts with QF=X, where X denotes an unknown initial state, and the process then needs Q set to a binary value, this model will force the process to set CK=1 and to assign other inputs of the data cone to values that allow the FF to be initialized.

Figure 5:
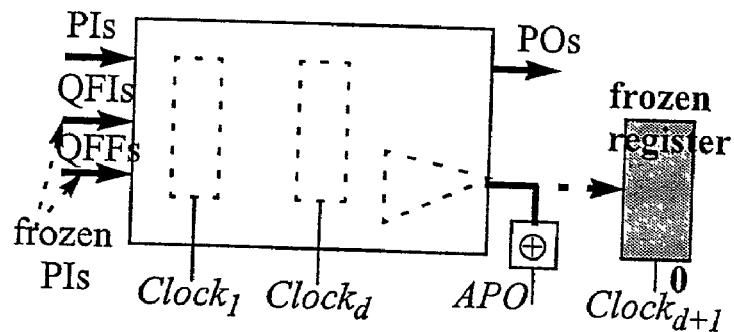
FIG. 5 shows a combinational model of an example sequential circuit for a single time frame in accordance with the invention.

The same model, not necessarily including the QF to D connection, may be used for all FFs in the FF circuits 202 and frozen register 204. For frozen FFs, one can set CK=0, and for transparent FFs one can set CK=1. This will result in a combinational circuit as shown in FIG. 5, which will serve herein as a model for a single time frame. The frozen PIs carrying the previous state of internal FFs are denoted as QFIs, and are distinguished from those PIs that carry the state of the frozen register, which are denoted QFFs. Clocks are modeled as independent PIs. The figure shows only one clock per level, but it is to be appreciated that there may be multiple such clocks at every level. The combinational model of FIG. 5 is possible because every internal FF is clocked at most once during a clock wave. The combinational vector generated in the corresponding single time frame is kept constant while the clock wave is applied. It should be noted that the single time frame in this model corresponds to d+1 conventional time frames.

In order to make faults from any "invisible" logic also observable within the above-noted single time frame, without clocking the frozen register, the model of FIG. 5 includes an additional PO, denoted APO, that observes all the inputs of the frozen register via an XOR tree. This technique is used to improve observability, is independent of clock control, has negligible impact on timing, and is compatible with at-speed testing. Additional details regarding similar techniques can be found in J. R. Fox, "Test-Point Condensation in the Diagnosis of Digital Circuits," Proc. of IEE, Vol. 124, No. 2, pp. 89–94, February 1977, which is incorporated by reference herein.

Figure 6:
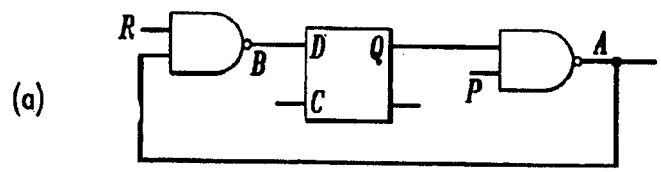
FIG. 6 illustrates the processing of a fault associated with a duplicated circuit line in accordance with the invention.

FIG. 6 illustrates the processing of a fault associated with a duplicated circuit line in accordance with the invention. In part (a) of the figure, gate A is in the data cone of the FF but also on any forward path from Q to a PO. Because the FIG. 4 model breaks the feedback loop at Q, such a gate should be duplicated so that one copy is in the data cone and the other in a fanout cone of Q. In part (b) of the figure, A1 is the "back" copy of gate A, and A0 is the "forward" copy of gate A. In a case in which a gate appears in the data cones and the fanout cones of two self-loop FFs, the gate will be duplicated only once when building the model.

For any single stuck-at fault in the original circuit, the equivalent fault is preferably injected in the combinational model used for automatic test pattern generation. If the fault resides on a line that is duplicated, a multiple stuck-at fault is injected in the combinational model to generate a valid test pattern. For example, if the fault being targeted is output A being stuck-at-one (s-a-1) in the circuit shown in part (a) of FIG. 6, the multiple stuck-at fault {A0 s-a-1,A1 s-a-1} should be injected in the model in part (b) of FIG. 6. In a case in which the fault effect on the back copy can be propagated only through the forward copy of the same line, only the single fault on the forward copy is sufficient, which is the case in the FIG. 6 example.

Fault injection may be implemented, by way of example, using a fault simulator such as the PROOFS fault simulator described in T. M. Niermann et al., "PROOFS: A Fast, Memory-Efficient Sequential Circuit Fault Simulator," IEEE Trans. CAD, vol. 11, no. 2, pp. 198–207, Feb., 1992, which is incorporated by reference herein.

Figure 7:
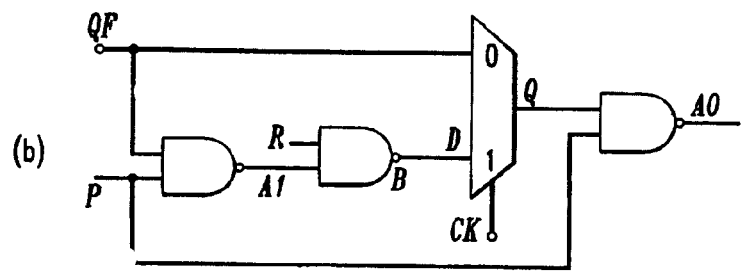
FIG. 7 shows a model for an example stuck-at-zero fault suitable for use in accordance with the invention.

FIG. 7 shows a model for an example stuck-at-zero (s-a-0) fault. The s-a-0 fault is shown between nodes A and B on the left side of the figure. In the model, shown on the right side of the figure, the second input of an AND gate inserted between nodes A and B is set to a frozen composite value 1/0 to keep the fault effect. In this way, just trying to propagate the fault effect would involve setting A=1, which is also the condition for activating the fault effect in the real circuit. Similarly, an OR gate may be used for modeling a stuck-at-one (s-a-1) fault between A and B.

Figure 8:
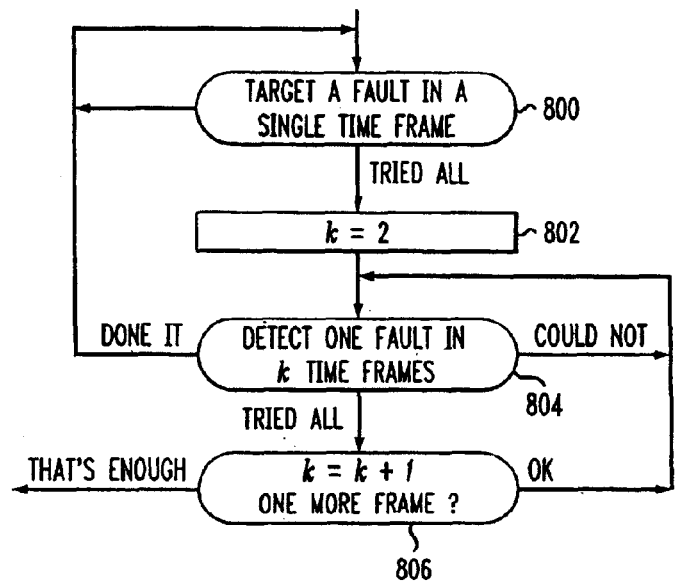
FIG. 8 is a flow diagram of an example test pattern generation process for use in testing a sequential circuit having the clock-control DFT structure of FIG. 5A or FIG. 5B.
Figure 9:
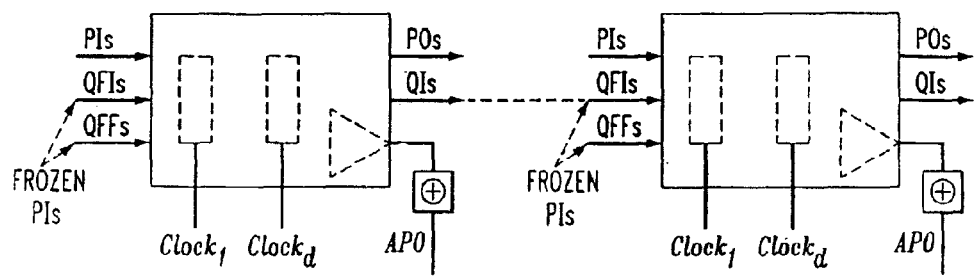
Figure 10:
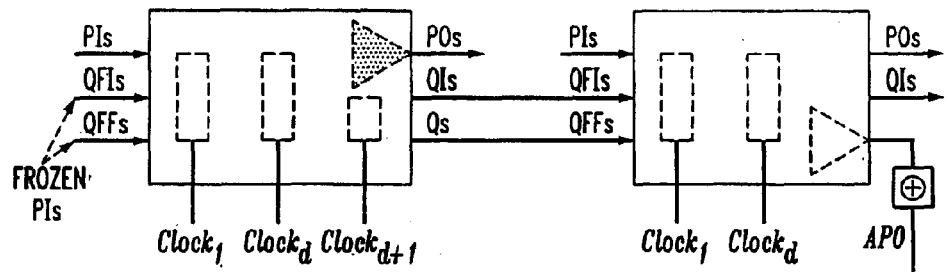
Figure 11:
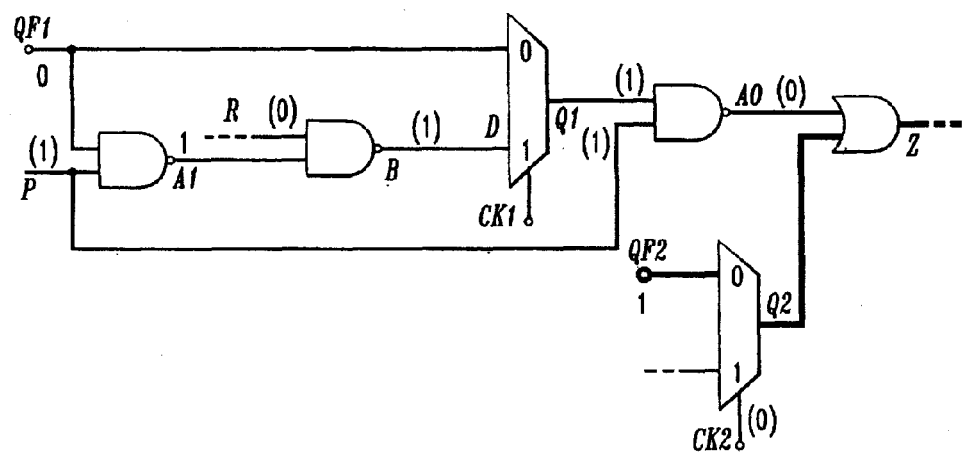
Figure 12:
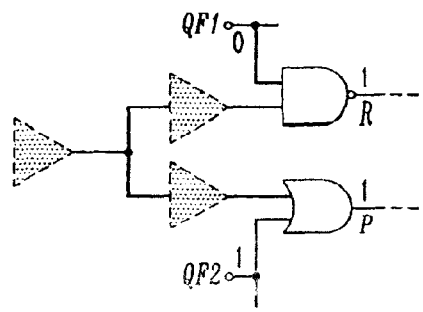
Figure 13:
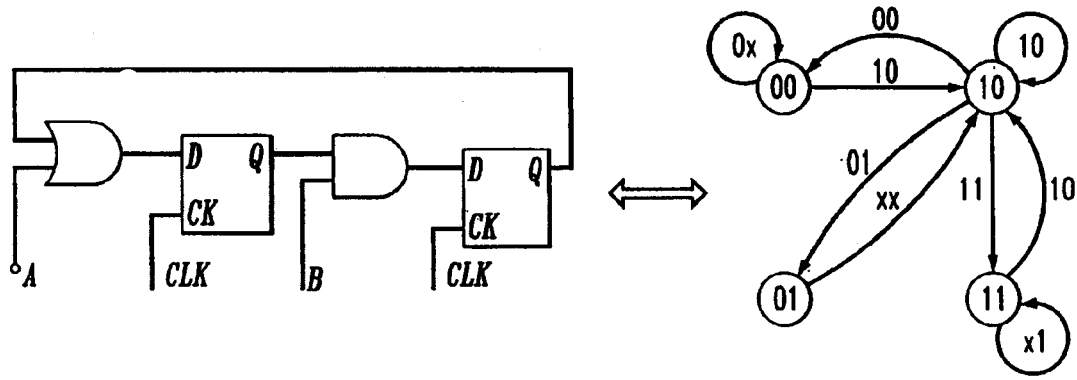
Figure 14:
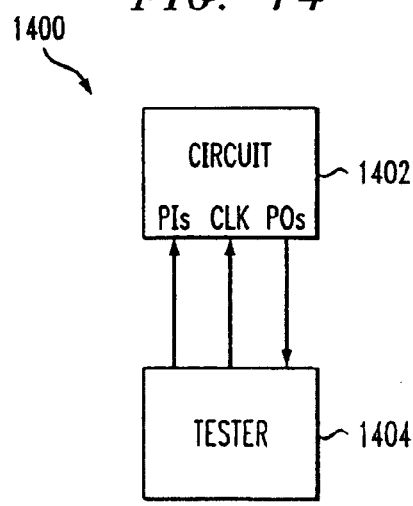
Figure 1:
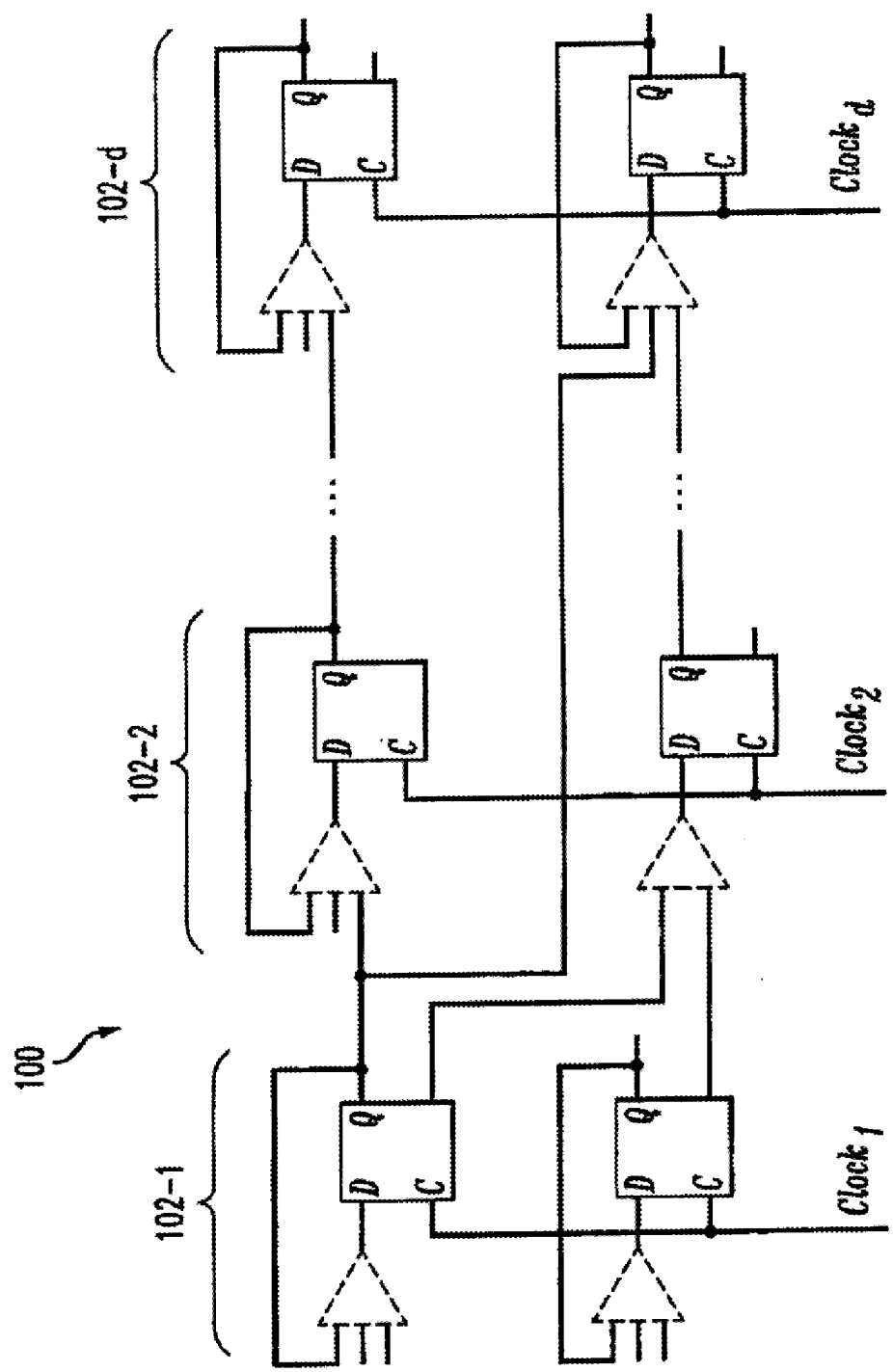
Figure 2A:
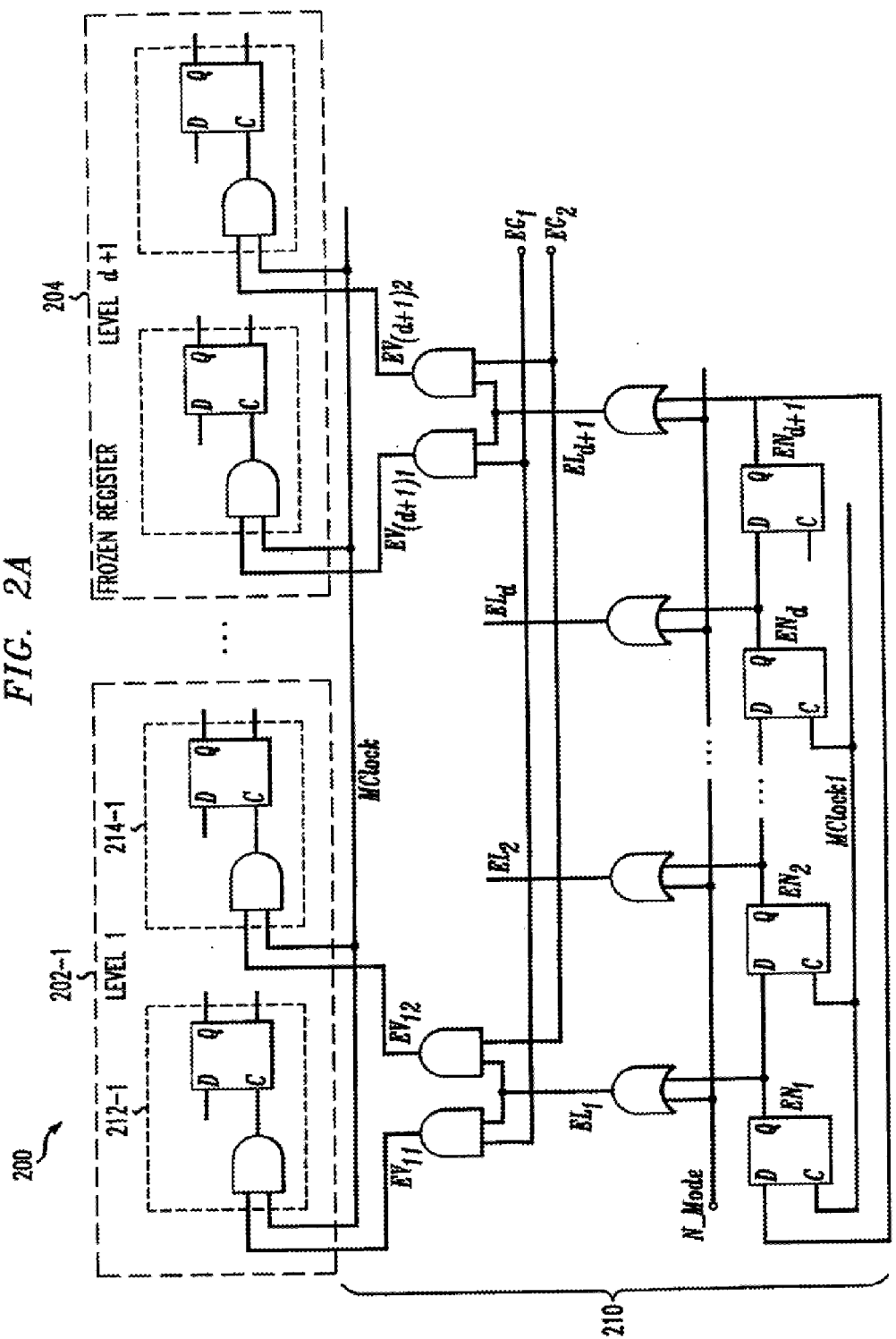
Figure 2B:
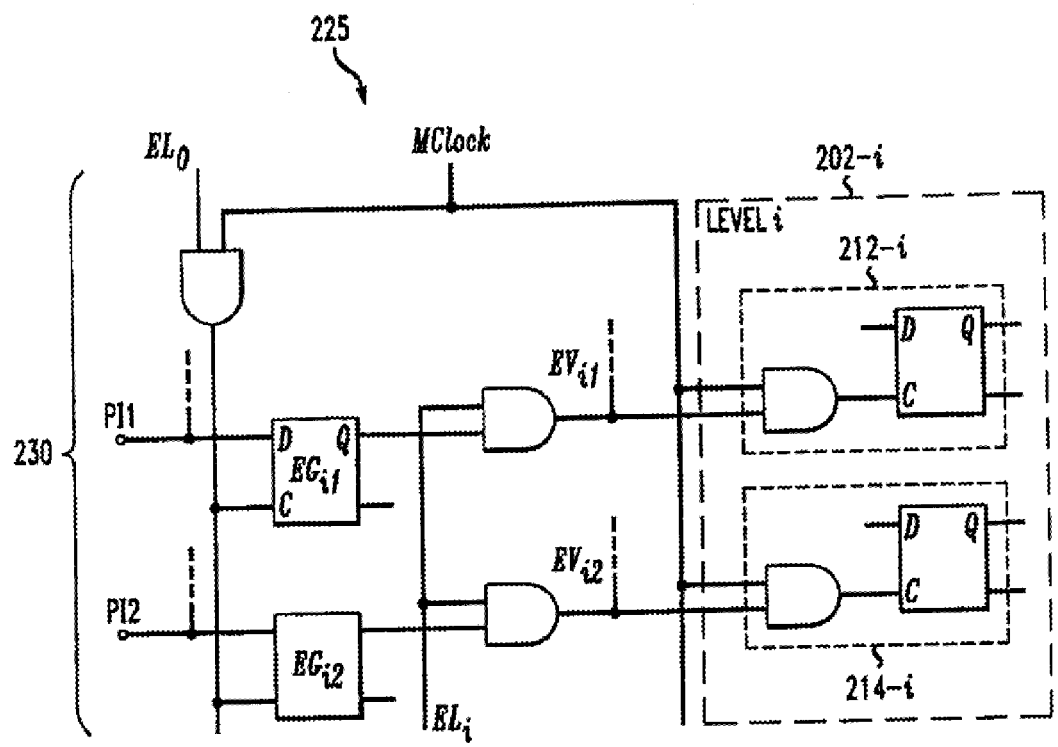
Figure 3:
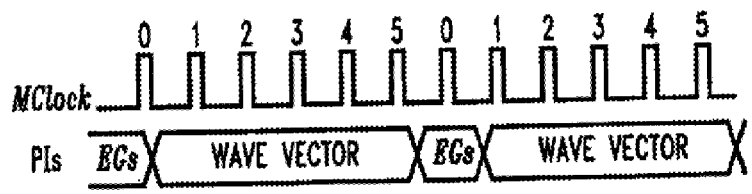
Figure 4:
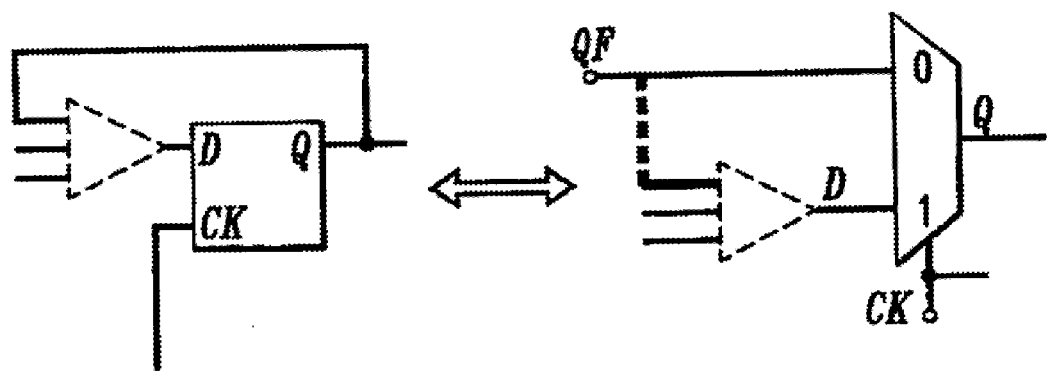
Figure 5:
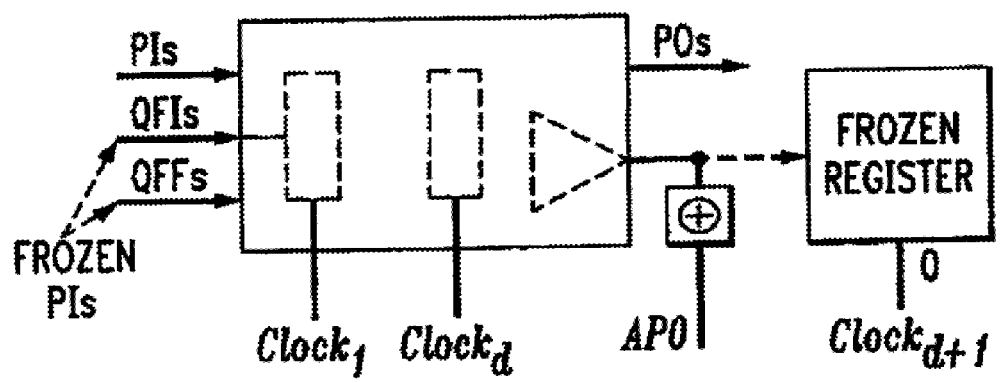
Figure 8:
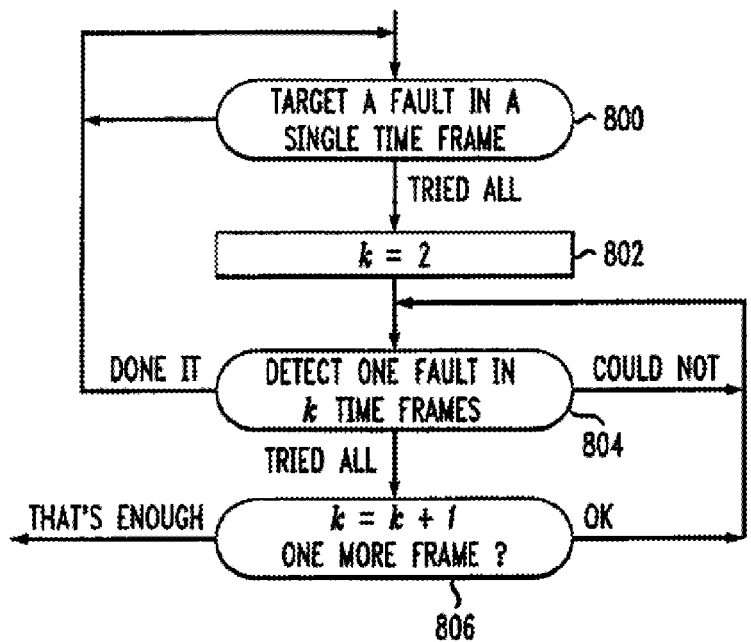
Figure 9:
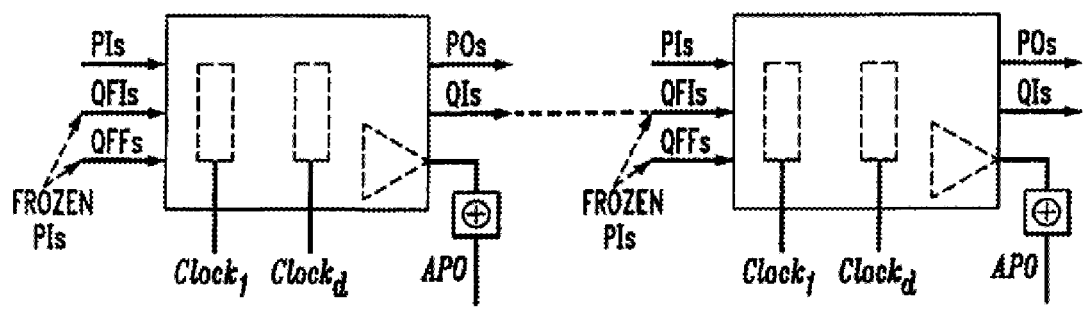
Figure 10:
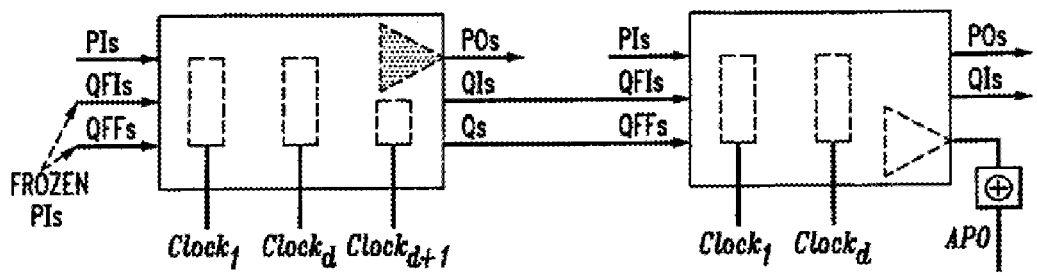
Figure 11:
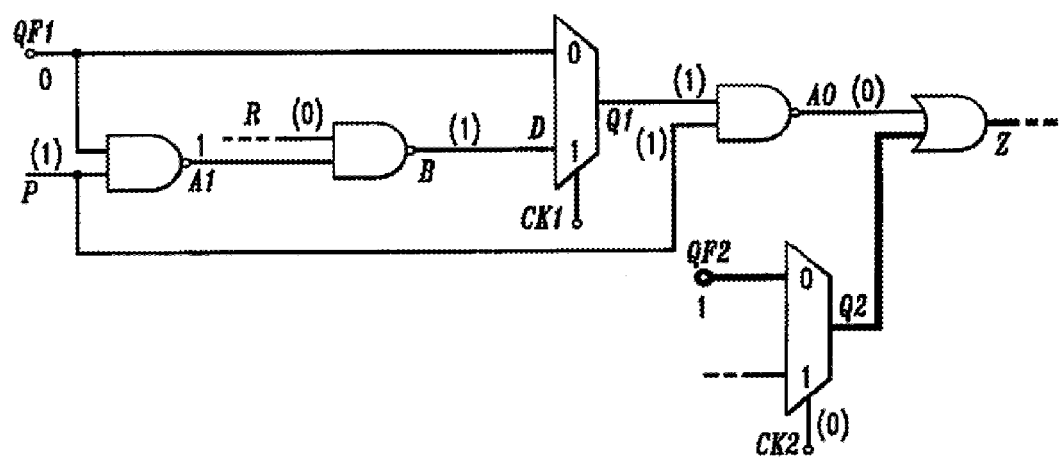
Figure 12:
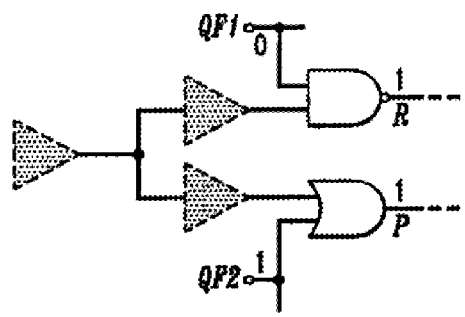
Figure 13:
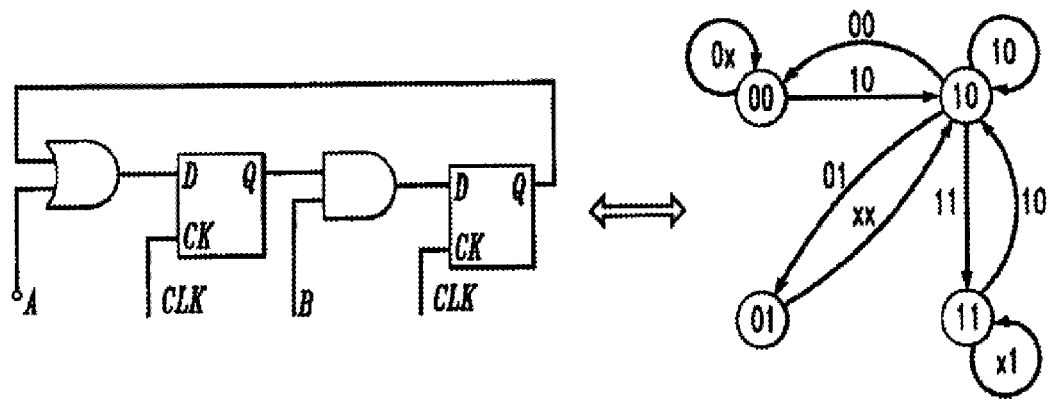
Figure 14:
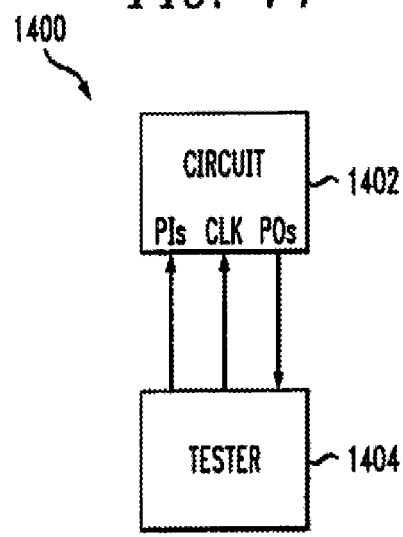

FIG. 8 is a flow diagram of an illustrative ATPG process in accordance with the invention, for testing a sequential circuit having a clock-control DFT structure as described in conjunction with FIG. 2A or 2B, utilizing the modeling techniques described in conjunction with FIGS. 4, 5, 6 and 7. The illustrative ATPG process of FIG. 8 is also referred to herein as WAVEXPRESS and comprises an opportunistic algorithm that tries to detect all detectable faults with minimal computational effort. Unlike most conventional ATPG algorithms, which work on a selected target until it is detected or proven untestable, WAVEXPRESS abandons the current target if it cannot detect it quickly, and moves to other targets that may be easier to detect in the current state.

As shown in step 800 of FIG. 8, the WAVEXPRESS algorithm starts with a single time frame, and tries to detect as many faults as possible without changing the current frozen state. Before targeting faults, WAVEXPRESS analyzes the set of targets and eliminates many faults whose detection is not possible given the currently frozen PI values. After all potentially detectable faults have been targeted within a single time frame, WAVEXPRESS switches to a model with k time frames, starting with k=2, as indicated in steps 802 and 804. After the first fault is detected using a sequence of k vectors, WAVEXPRESS reverts to the single time frame loop, i.e., the loop around step 800, with a new state of the frozen register. The number of time frames k is increased in step 806 only when not even one fault could be detected with k time frames.

All assignable PIs, including clocks, start with an unknown logic value. If WAVEXPRESS detects the selected target fault, every generated vector is expanded into a sequence of d+1 identical vectors and their associated clock wave. The values of the clock PIs are mapped into settings for the $EV_{ij}$ signals described previously. Clocks left unassigned are not activated, to save power and if possible to preserve fault effects stored in internal FFs. Any unassigned PIs are set to random binary values. The resulting sequence is preferably fault simulated using, e.g., the above-noted PROOFS fault simulator.

Note that in the test generation model, the POs are observed only after the d-level FFs have been clocked, but in the fault simulation model they are observed after every clock. This is equivalent to applying several random vectors in between the generated vectors, and these vectors may detect additional faults. The results of the PROOFS fault simulator are ported back into the WAVEXPRESS ATPG algorithm to enable fault dropping and reporting of stored fault effects. The ATPG algorithm and the fault simulator may be implemented as separate software programs which communicate via conventional sockets, as will be appreciated by those skilled in the art.

Figure 9:
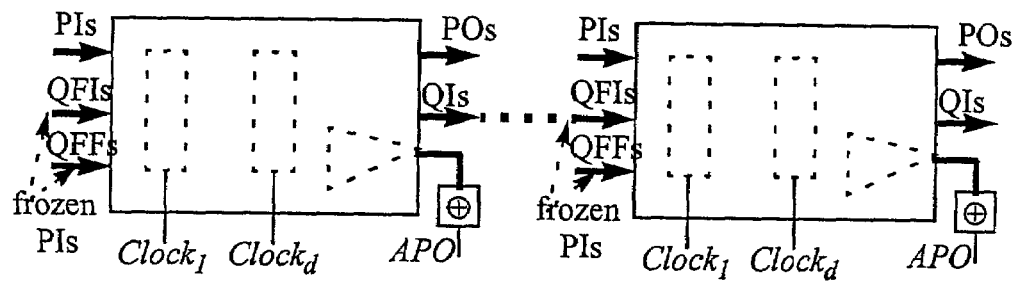
FIG. 9 shows a combinational model for an example series of separated time frames in accordance with the invention.

FIG. 9 illustrates the operation of the first loop of WAVEXPRESS, i.e., the loop around step 800, showing two consecutive time frames. After a vector is generated in the first time frame on the left side of the figure, the changed values of internal FFs are propagated to the QFI inputs of the next time frame, shown on the right side of the figure, before a new fault is targeted. These values are frozen for ATPG. Except for this value transfer, denoted by the dotted line from the left side to the right side of the figure, consecutive time frames are not connected, so WAVEXPRESS works separately with each time frame in this first loop. The values of frozen register QFFs are the same in every time frame.

Figure 10:
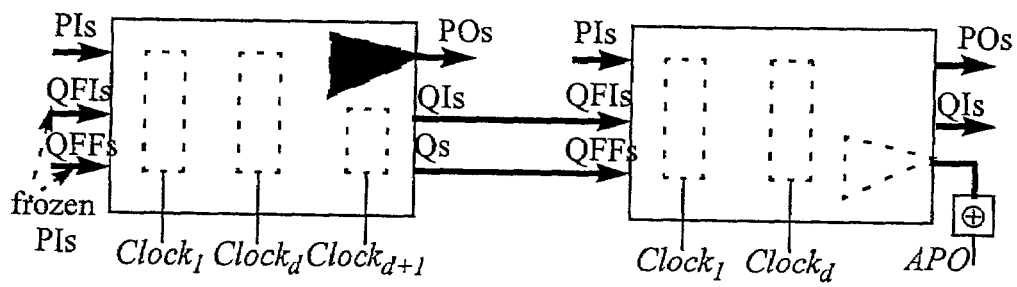
FIG. 10 shows a combinational model for an example series of connected time frames in accordance with the invention.

FIG. 10 depicts a model with two time frames, used in step 804 of FIG. 8 after all targets have been tried with one time frame. The previously frozen register is now allowed to change, and its clock ($Clock_{d+1}$) is now an assignable PI in the first time frame. No inputs are frozen in the second time frame, as every QF input is connected with its corresponding Q output from the first time frame. All POs in the first time frame are ignored, since none of the remaining targets could be detected at these Pos. Similarly, in a model with k time frames, all POs in the first k −1 time frames are ignored.

Although WAVEXPRESS backtraces objectives to PIs, it is advantageously configured to avoid backtracing toward the PIs with frozen values. Backtracing can span multiple time frames. Since decisions are done only as PI assignments, WAVEXPRESS does not do explicit state justification, and it never has to justify illegal states.

Figure 11:
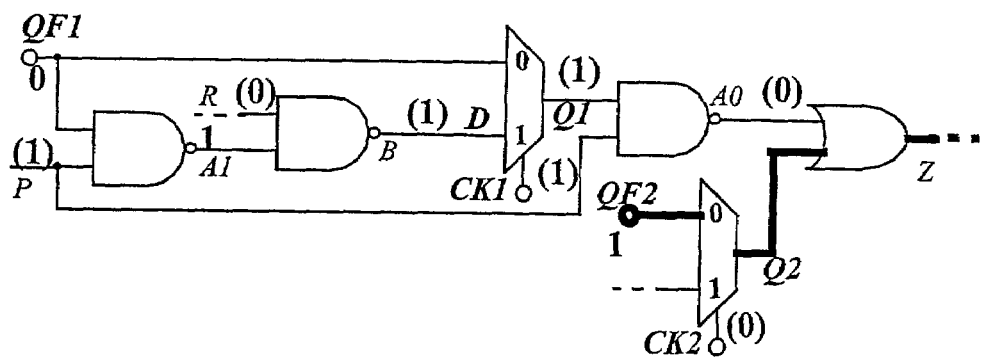
FIG. 11 illustrates the manner in which the test pattern generation process of FIG. 8 sets clock values in testing a sequential circuit having the clock-control DFT structure of FIG. 5A or FIG. 5B.

FIG. 11 illustrates how the WAVEXPRESS algorithm of FIG. 8 sets clock values. The circuit shown is a portion of a loopy pipe model containing two FFs with self-loops and initial states QF1=0 and QF2=1. Assume that QF2 carries some fault effects, and that WAVEXPRESS selects one of them as the next target. To propagate the fault effect to Q2 and Z, the algorithm must set CK2=0, which means that Q2 is not clocked, and A0=0. This in turn implies P=Q1=1. To set Q1=1 when the initial state QF1=0, CK1 must be 1, which shows that Q1 must be clocked.

A number of preprocessing steps may be used in conjunction with the FIG. 8 ATPG process. For example, the FIRES algorithm described in M. Iyer et al., "Identifying Sequential Redundancies Without Search," Proc. 33rd Design Automation Conf., June 1996, and the FUNI algorithm described in D. E. Long et al.,"FILL & FUNI: Algorithms To Identify Illegal States and Sequentially Untestable Faults," ACM Trans. on Design Automation of Electronic Systems, July 2000, both of which are incorporated by reference herein, may be used to identify combinationally and sequentially untestable faults.

Other techniques for identifying untestable faults are described in U.S. Pat. No. 5,559,811, issued Sep. 24, 1996 and entitled "Method For Identifying Untestable & Redundant Faults In Sequential Logic Circuits," and U.S. Pat. No. 5,566,187, issued Oct. 10, 1996 and entitled "Method For Identifying Untestable Faults In Logic Circuits," both of which are incorporated by reference herein.

In addition, the combinational test pattern generator ATOM described in I. Hamzaoglu et al.,"New Techniques for Deterministic Test Pattern Generation," Proc. VLSI Test Symp, pp. 446–452, April 1998, which is incorporated by reference herein, may be run on a full-scan model of the circuit to identify the rest of the combinationally untestable faults. Any untestable faults identified by these preprocessing operations are removed from the set of target faults used by the FIG. 8 process. These same faults would be much more computationally expensive to target in test generation.

Since the frozen PI values may preclude the activation or the observation of many still undetected faults, WAVEXPRESS removes these faults from the current set of target faults, so that only potentially detectable faults will be targeted. For example, in the circuit in FIG. 12, R s-a-1 and P s-a-1 cannot be activated, and no fault in the shaded areas can be observed.

Faults whose effects are stored in currently observable frozen or internal FFs are always included in the set of targets. Among these, priority is given to fault effects stored in internal FFs, since the application of a clock wave may change their state. The set of targets is incrementally updated after every clock wave.

WAVEXPRESS may make use of additional heuristics based on testability measures to select a target most likely to be detected in the current state. Such heuristics are well-known to those skilled in the art. It is also possible to enforce a limit on the number of times the same fault is going to be targeted.

It should be noted that a significant difference between using a sequence of k separated time frames as illustrated in FIG. 9 and an array of k connected time frames as illustrated in FIG. 10 is the size of the ATPG search space. For separated time frames, after one vector has been generated and the algorithm has advanced to the next time frame, there is no way to backtrack a decision taken in a previous time frame. However, this type of backtracking is possible in the connected time frames model. For m PIs, the search space in a single time frame comprises $2^m$ vectors. For k separated time frames, the combined search space is additive, leading to a total search space size of $k2^m$. For k connected time frames, the combined search space is multiplicative, for a total search space size of $2^{km}$. Hence the difference between the two cases increases exponentially with the number of time frames. Advantageously, the WAVEXPRESS algorithm detects most faults by separated time frames, which tends to reduce the size of the search space and thus the computational complexity of the algorithm.

Figure 13:
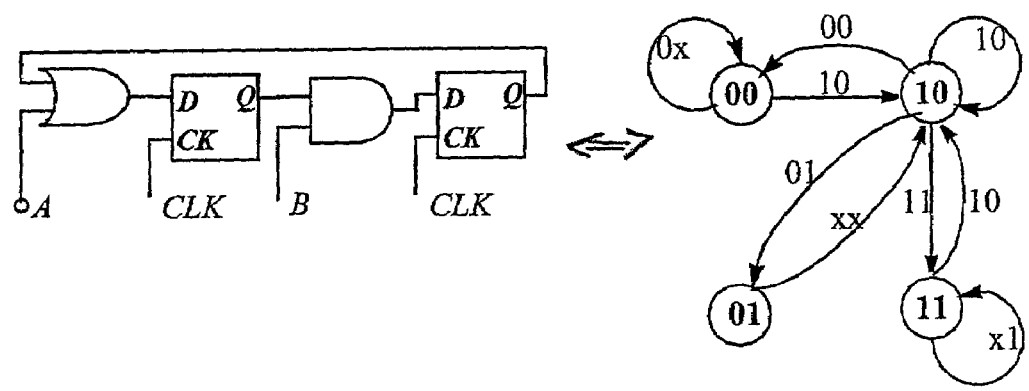
FIG. 13 shows an example circuit and corresponding state diagram illustrating an undetectable fault.

It should also be noted that because clock partitioning of the type described above disables sequentially reconvergent fanout, it usually transforms some faults untestable in the original circuit into detectable faults. FIG. 13 shows an example circuit and corresponding state diagram addressing the issue of whether constraints introduced by clock wave testing can cause testable faults to become untestable. All four states shown in the state diagram are legal in this circuit, but having separated clocks for the two FFs makes state 01 unreachable, since the only transition leading to state 01 requires concurrent changes of both FFs. So any fault whose detection requires the illegal state would become untestable. In practice, however, this effect is usually negligible.

The FIG. 8 ATPG process may be implemented in a conventional personal computer, workstation or other processor-based system. For example, the process may be implemented as one or more software programs executed on a Pentium III computer with 256 Mb memory, a Sun SPARC Ultra-Enterprise computer, or other suitable processor-based system.

Figure 14:
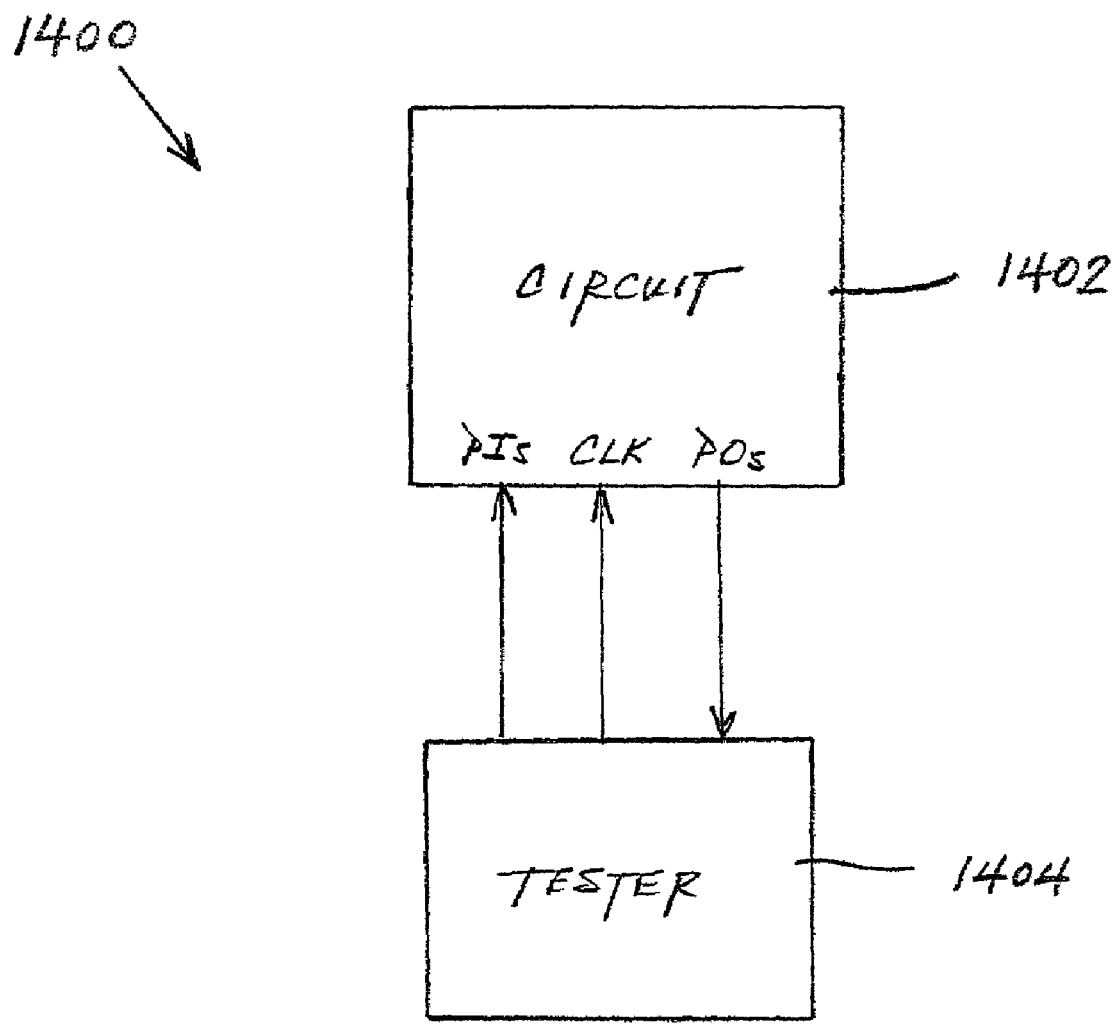
FIG. 14 shows a block diagram of a test configuration in which the invention may be implemented.
Figure 1:
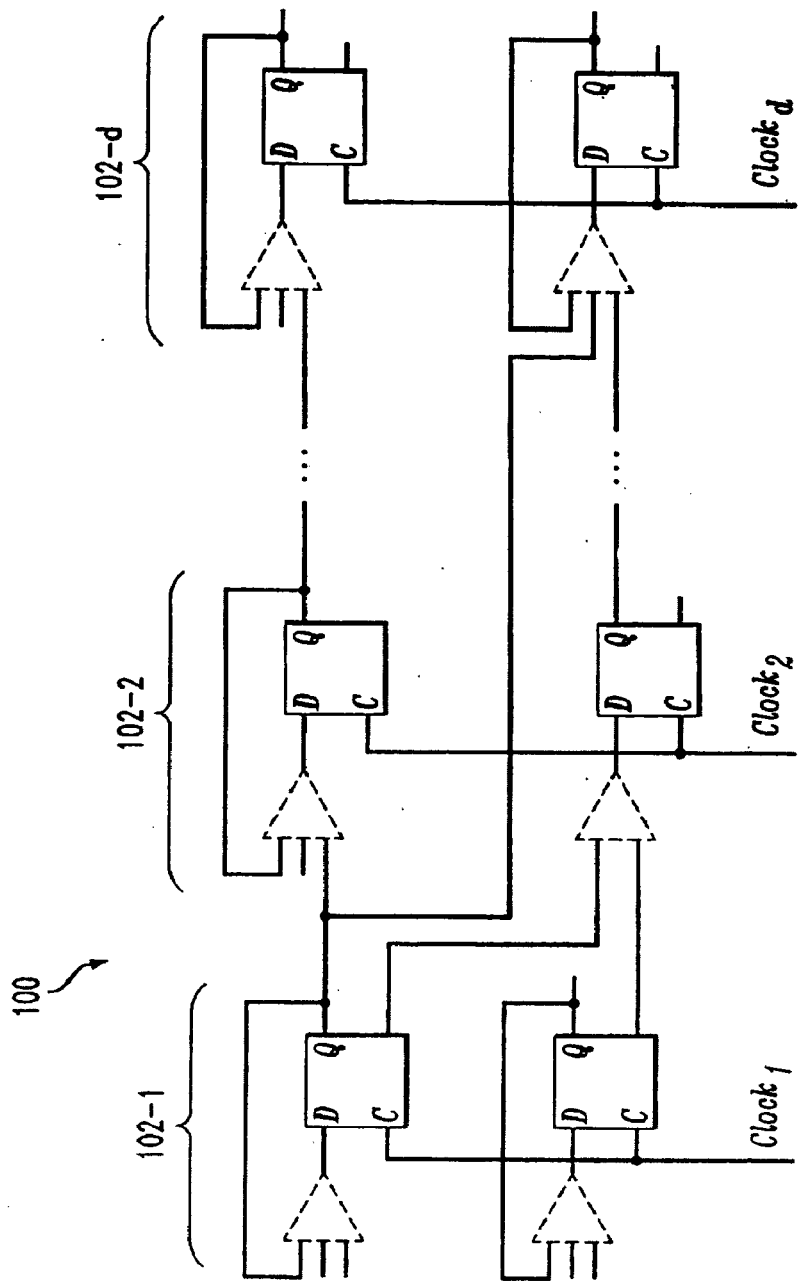
Figure 2A:
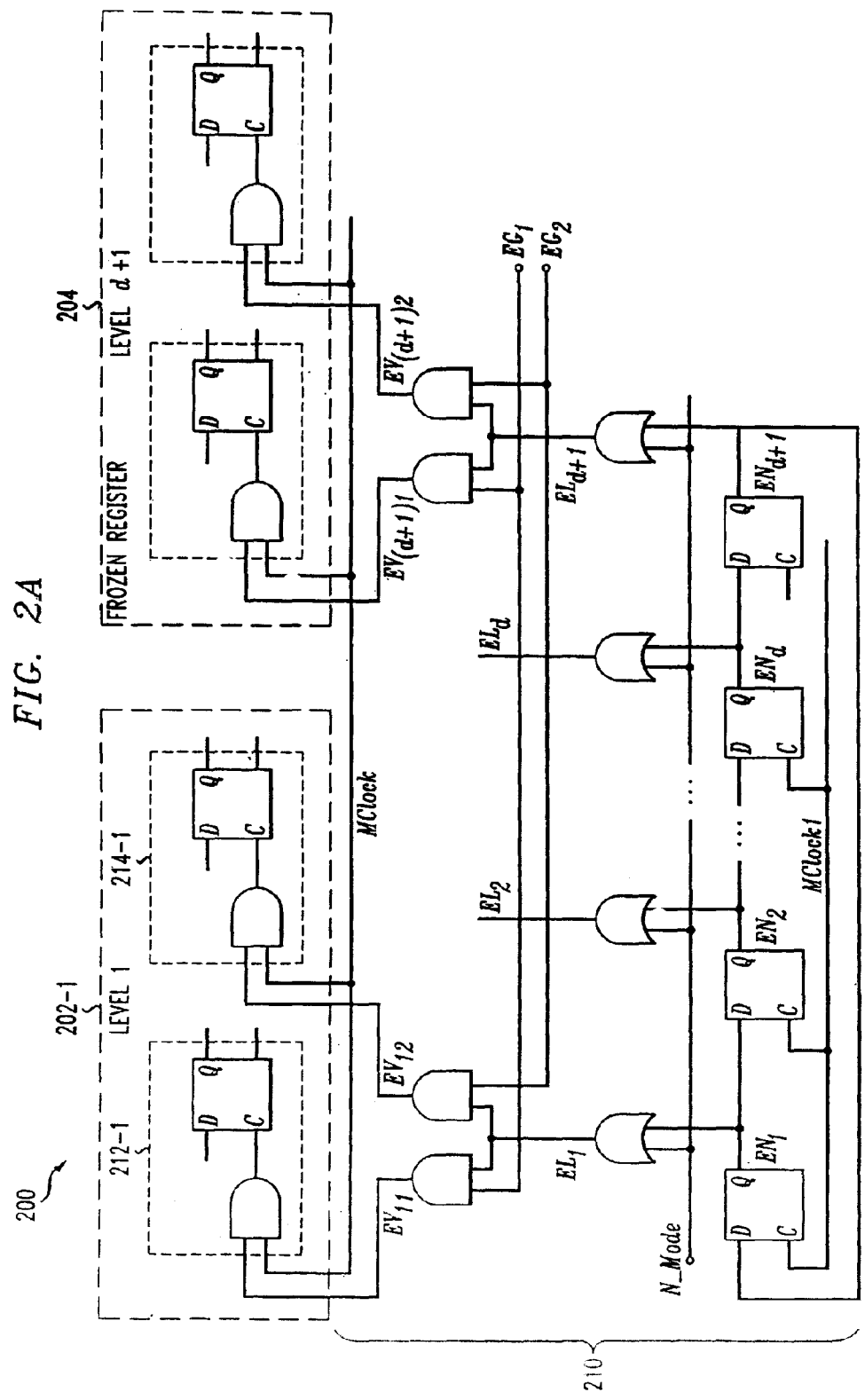
Figure 2B:
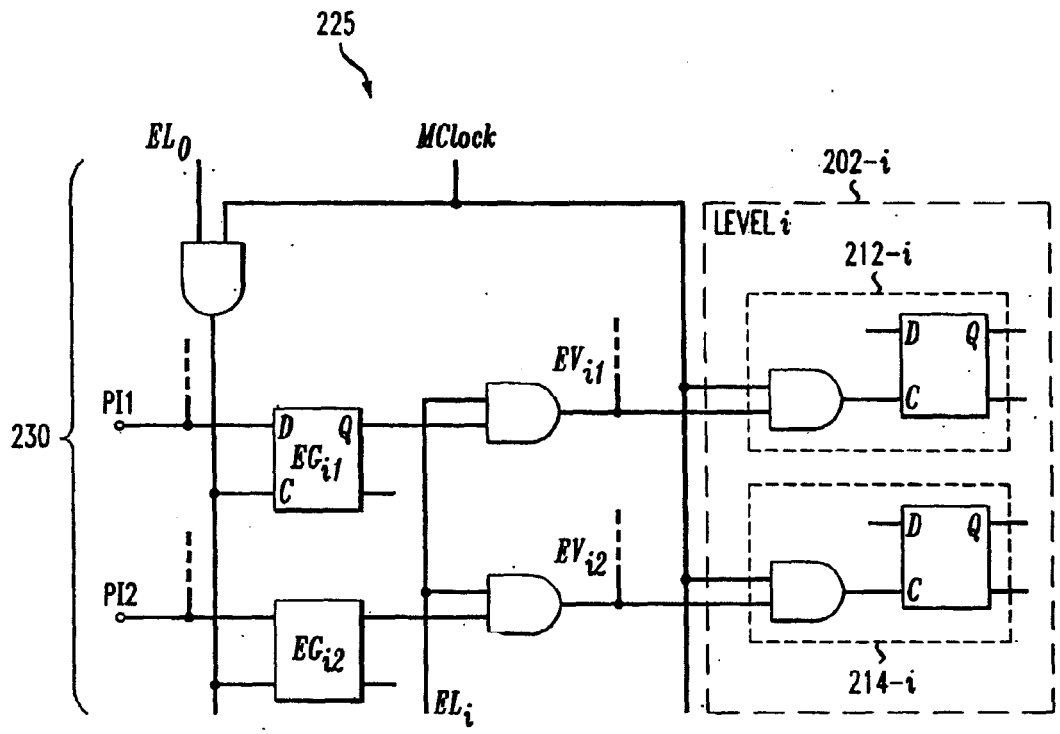
Figure 3:
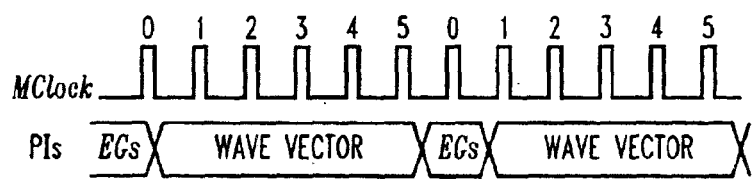
Figure 4:
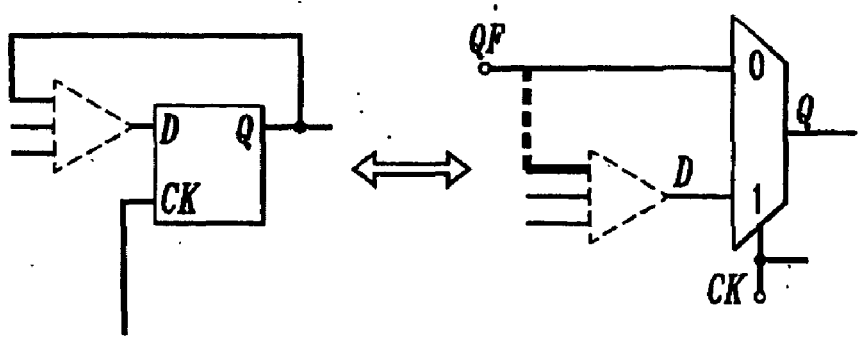
Figure 5:
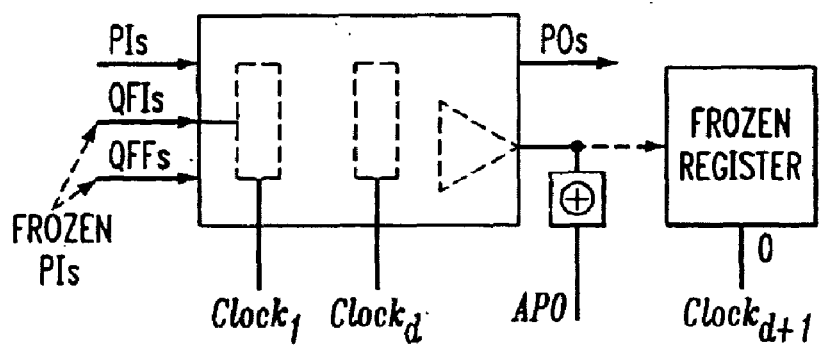

FIG. 14 shows one example of a test system in which the invention may be implemented. In this example, a circuit 1402 is coupled to a tester 1404. The tester 1404 supplies PIs and one or more clock signals to the circuit 1402 and observes the POs of the circuit 1402. The tester 1404 may be external to the circuit 1402 as shown in the figure or alternatively may be viewed as an embedded tester that is incorporated within the circuit 1402. In the case of an embedded tester, the combinational vectors may be randomly generated, and the tester can keep a given vector constant while applying clocks to transparent registers. This type of embedded tester is an example of a built-in self-test (BIST) implementation of the present invention.

The tester 1404 is preferably configured to apply test vectors generated by an ATPG software program running on a processor-based device coupled to the tester 1404. As a possible alternative implementation, the tester 1404 may itself be a computer or other processor-based device which implements a test pattern generator in accordance with the invention, and applies the resulting test vectors to the circuit 1402.

One or more software programs for implementing the test pattern generation process of FIG. 8 may be stored in a memory of a processor-based device coupled to the tester 1404 and executed by a processor of that processor-based device. In the alternative implementation noted above, such functions may be implemented at least in part within the tester 1404 itself.

The above-described embodiments of the invention are intended to be illustrative only. For example, alternative embodiments may be configured which utilize different DFT structures, different modeling techniques, and different ATPG process steps, as well as processing and test platforms other than those specifically described herein. In addition, although illustrated using a single clock domain, e.g., a partitioned clock signal arrangement in which multiple clock signals are derived from a related master clock, the techniques of the invention can also be applied to multiple clock domains. Furthermore, although illustrated using flip-flops, the invention can be implemented using other types of registers. As indicated above, the invention may be implemented at least in part in software, e.g., in one or more software programs stored on a computer-readable medium or other type of storage medium, and in various combinations of hardware and software. These and numerous other alternative embodiments within the scope of the following claims will be apparent to those skilled in the art.

What is claimed is:

1. A method of performing test pattern generation for a circuit, the method comprising the steps of:
   separating the circuit into a plurality of overlapping pipelines by controlling corresponding clocks for one or more registers of the circuit so as to break feedback loops of the circuit; and
   processing each of the pipelines separately in order to determine if particular target faults are detectable in the pipelines.

2. The method of claim 1 wherein each of at least a subset of the registers of the circuit is controlled by an independent clock.

3. The method of claim 1 wherein a given one of the clocks associated with at least one of the registers is controlled so as to break a particular feedback loop of the circuit by freezing that clock.

4. The method of claim 1 wherein each of at least a subset of the overlapping pipelines comprises a balanced pipeline in which every path between two combinational blocks $C_i$ and $C_j$ of the circuit passes through the same number of registers.

5. The method of claim 1 wherein for a given one of the pipelines each of a plurality of flip-flops associated with a register having a clock which has been frozen in that pipeline is processed as a primary input of the circuit having a frozen value that cannot be changed during the test pattern generation process.

6. The method of claim 1 wherein for a given one of the pipelines combinational logic of the circuit that feeds only one or more registers having clocks which have been frozen in that pipeline is removed from that pipeline.

7. The method of claim 1 wherein for a given one of the pipelines any one of the registers having a clock which is not frozen and which feeds primary outputs of the circuit is designated as a transparent register in that pipeline.

8. The method of claim 1 wherein for a given one of the pipelines any one of the registers having a clock which is not frozen and which feeds only combinational logic of the circuit that feeds one or more registers having clocks which are frozen in the given pipeline is designated as a capture register and cannot be used to detect faults in the given pipeline.

9. The method of claim 1 wherein the processing step further comprises a first processing step which detects target faults in a single time frame, and a second processing step which detects target faults in two or more time frames.

10. The method of claim 9 wherein the first processing step generates as many combinational test vectors as possible for each of at least a subset of the pipelines.

11. The method of claim 9 wherein the second processing step generates a sequence of two or more combinational test vectors for a specified number of two or more time frames for each of at least a subset of the pipelines.

12. The method of claim 1 wherein at least the separating and processing steps are implemented in a test generator which is external to the circuit.

13. The method of claim 1 wherein at least the separating and processing steps are implemented in a test generator which is embedded within the circuit in a built-in self-test (BIST) configuration, the test generator generating one or more combinational vectors in a random manner.

14. An apparatus for performing test pattern generation for a circuit, the apparatus comprising:
   a processor-based device operative to separate the circuit into a plurality of overlapping pipelines by controlling corresponding clocks for one or more registers of the circuit so as to break feedback loops of the circuit, and to process each of the pipelines separately in order to determine if particular target faults are detectable in the pipelines.

15. The apparatus of claim 14 wherein each of at least a subset of the registers of the circuit is controlled by an independent clock.

16. The apparatus of claim 14 wherein a given one of the clocks associated with at least one of the registers is controlled so as to break a particular feedback loop of the circuit by freezing that clock.

17. The apparatus of claim 14 wherein each of at least a subset of the overlapping pipelines comprises a balanced pipeline in which every path between two combinational blocks $C_i$ and $C_j$ of the circuit passes through the same number of registers.

18. The apparatus of claim 14 wherein for a given one of the pipelines each of a plurality of flip-flops associated with a register having a clock which has been frozen in that pipeline is processed as a primary input of the circuit having a frozen value that cannot be changed during the test pattern generation process.

19. The apparatus of claim 14 wherein for a given one of the pipelines combinational logic of the circuit that feeds only one or more registers having clocks which have been frozen in that pipeline is removed from that pipeline.

20. The apparatus of claim 14 wherein for a given one of the pipelines any one of the registers having a clock which is not frozen and which feeds primary outputs of the circuit is designated as a transparent register in that pipeline.

21. The apparatus of claim 14 wherein for a given one of the pipelines any one of the registers having a clock which is not frozen and which feeds only combinational logic of the circuit that feeds one or more registers having clocks which are frozen in the given pipeline is designated as a capture register and cannot be used to detect faults in the given pipeline.

* * * * *

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : M. Abramovici et al.

It is certified that error appears in the above-identified patent and that said Letters Patent is hereby corrected as shown below:

On page 1, in OTHER PUBLICATIONS:

Please delete Item [56]

"1. M. Abramovici et al., "FREEZE!: A New Approach for Testing Sequential Circuits," Proc. 29th Design Automation Conf., pp. Jun. 22-25, 1992."

and insert

--M. Abramovici et al., "FREEZE!: A New Approach for Testing Sequential Circuits," Proc. 29th Design Automation Conf., pp. 22-25, Jun. 1992.--

In the Specification:

Col. 2, line 35, delete "d 1" and insert --d + 1--.

In the Drawings:

Please delete drawing sheets 1-7 and insert the attached drawing sheets 1-8.

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

PATENT NO.        : 7,017,096 B2
APPLICATION NO. : 10/106960
DATED             : March 21, 2006
INVENTOR(S)       : Abramovici et al.

It is certified that error appears in the above-identified patent and that said Letters Patent is hereby corrected as shown below:

Please replace the claim set with the following claim set:

1. A method of testing a circuit comprising a plurality of registers, the method comprising the steps of:
configuring the circuit such that substantially all feedback loops associated with the registers, other than one or more self-loops each associated with a corresponding one of the registers, are broken; and
generating test patterns for application to the circuit, the test patterns being applied to the circuit in conjunction with partitioned clock signals each of which is associated with a corresponding portion of the circuit containing at least one of the self-loops.

2. The method of claim 1 wherein the configuring step further comprises breaking a given one of the feedback loops other than the self-loops by temporarily freezing a clock signal associated with at least one register in the given one of the feedback loops.

3. The method of claim 1 wherein the feedback loops of the circuit include only self-loops each comprising a single register, such that the configuring step does not involve the breaking of any feedback loops of the circuit.

4. The method of claim 1 wherein the configuring step is implemented using a design for testability structure which provides partitioning of a master clock into multiple clock signals each associated with a corresponding one of a plurality of levels of self-loops so as to permit breaking of the feedback loops other than the self-loops.

5. The method of claim 1 wherein the registers of the circuit are arranged in a plurality of groups, with each of the registers in a given one of the groups being clocked by a corresponding clock signal.

6. The method of claim 1 wherein the registers of the circuit are arranged in levels by assigning a first one of the levels to each register which is fed only by primary inputs of the circuit, and then assigning to level $i+1$ every register that is fed by other registers whose maximum level is $i$, where $i = 1, 2, \ldots d$, and $d$ is the sequential depth of the circuit.

7. The method of claim 6 wherein each of at least a subset of the levels of the registers has multiple groups of registers associated therewith.

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

8. The method of claim 6 wherein the partitioned clock signals are generated utilizing a design for testability structure configured such that all registers at the same level have associated therewith a corresponding independently controllable clock signal.

9. The method of claim 6 wherein the partitioned clock signals are applied to the levels in the form of a clocking sequence comprising a plurality of clock pulses, with a first one of the clock pulses being applied to a first one of the levels, then a second one of the clock pulses being applied to a second one of the levels, . . . and then a final one of the clock pulses being applied to a final one of the levels, such that a given one of the applied test patterns propagates through the circuit.

10. The method of claim 9 wherein the given applied test pattern is kept constant for $d+1$ clock cycles, with cycle $d+1$ being used to allow changes in level-$d$ registers to propagate to primary outputs of the circuit.

11. The method of claim 4 wherein the design for testability structure comprises a circular shift register for generating $d+1$ clock signals each being applied to a corresponding one of $d+1$ levels, where $d$ is the sequential depth of the circuit.

12. The method of claim 4 wherein the design for testability structure further comprises logic circuitry including at least one of level selection circuitry and group selection circuitry, the level selection circuitry configured for selecting a particular one of the levels for receiving a corresponding one of the clock signals, the group selection circuitry configured for selecting a particular group of registers within a given one of the levels for receiving a corresponding one of the clock signals, the group selection circuitry thereby allowing further partitioning of the registers of the circuit within a given level.

13. The method of claim 12 wherein the group selection circuitry of the design for testability structure is implemented using $G$ additional primary inputs of the circuit, where $G$ is the maximum number of groups at any level.

14. The method of claim 12 wherein the group selection circuitry of the design for testability structure is implemented using a plurality of additional registers $EG_{ij}$, each of the registers $EG_{ij}$ storing an enable value for a corresponding group $j$ at level $i$.

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

15. The method of claim 1 wherein the generating step further comprises a first processing step which detects target faults in a single time frame, and a second processing step which detects target faults in two or more time frames.

16. The method of claim 15 wherein the generating step after targeting all potentially detectable faults in the single time frame via the first processing step proceeds in the second processing step to target all potentially detectable faults in $k$ time frames, where $k$ is initially set to a value of two for a first iteration of the second processing step and is incremented for a subsequent iteration of the second processing step only when no faults are detected in the previous iteration of the second processing step.

17. The method of claim 1 wherein at least one of the configuring step and the generating step is implemented at least in part in a processor-based device which is external to the circuit.

18. The method of claim 1 wherein at least one of the configuring step and the generating step is implemented at least in part in a processor-based device which is embedded within the circuit in a built-in self-test (BIST) configuration.

19. An apparatus for testing a circuit comprising a plurality of registers, the apparatus comprising:
a processor-based device operative to configure the circuit via a design for testability structure such that substantially all feedback loops associated with the registers, other than one or more self-loops each associated with a corresponding one of the registers, are broken, and to generate test patterns for application to the circuit, the test patterns being applied to the circuit in conjunction with partitioned clock signals each of which is associated with a corresponding portion of the circuit containing at least one of the self-loops.

20. An apparatus for testing a circuit comprising a plurality of registers, the apparatus comprising:
means for configuring the circuit such that substantially all feedback loops associated with the registers, other than one or more self-loops each associated with a corresponding one of the registers, are broken; and
means for generating test patterns for application to the circuit, the test patterns being applied to the circuit in conjunction with partitioned clock signals each of which is associated with a corresponding portion of the circuit containing at least one of the self-loops.

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

21. An article of manufacture comprising a storage medium containing one or more software programs for use in testing a circuit comprising a plurality of registers, wherein the one or more software programs when executed by a processor implement the steps of:

configuring the circuit such that substantially all feedback loops associated with the registers, other than one or more self-loops each associated with a corresponding one of the registers, are broken; and generating test patterns for application to the circuit, the test patterns being applied to the circuit in conjunction with partitioned clock signals each of which is associated with a corresponding portion of the circuit containing at least one of the self-loops.

Signed and Sealed this

Twenty-fifth Day of March, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,017,096 B2 |
| APPLICATION NO. | : 10/106960 |
| DATED | : March 21, 2006 |
| INVENTOR(S) | : Abramovici et al. |

It is certified that error appears in the above-identified patent and that said Letters Patent is hereby corrected as shown below:

Column 11, delete lines 44 thru Column 14, line 7 (claims 1-21) and replace with the following claims 1-21:

1. A method of testing a circuit comprising a plurality of registers, the method comprising the steps of:
  configuring the circuit such that substantially all feedback loops associated with the registers, other than one or more self-loops each associated with a corresponding one of the registers, are broken; and
  generating test patterns for application to the circuit, the test patterns being applied to the circuit in conjunction with partitioned clock signals each of which is associated with a corresponding portion of the circuit containing at least one of the self-loops.

2. The method of claim 1 wherein the configuring step further comprises breaking a given one of the feedback loops other than the self-loops by temporarily freezing a clock signal associated with at least one register in the given one of the feedback loops.

3. The method of claim 1 wherein the feedback loops of the circuit include only self-loops each comprising a single register, such that the configuring step does not involve the breaking of any feedback loops of the circuit.

4. The method of claim 1 wherein the configuring step is implemented using a design for testability structure which provides partitioning of a master clock into multiple clock signals each associated with a corresponding one of a plurality of levels of self-loops so as to permit breaking of the feedback loops other than the self-loops.

5. The method of claim 1 wherein the registers of the circuit are arranged in a plurality of groups, with each of the registers in a given one of the groups being clocked by a corresponding clock signal.

6. The method of claim 1 wherein the registers of the circuit are arranged in levels by assigning a first one of the levels to each register which is fed only by primary inputs of the circuit, and then assigning to level $i+1$ every register that is fed by other registers whose maximum level is $i$, where $i = 1, 2, \ldots d$, and $d$ is the sequential depth of the circuit.

7. The method of claim 6 wherein each of at least a subset of the levels of the registers has multiple groups of registers associated therewith.

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

8. The method of claim 6 wherein the partitioned clock signals are generated utilizing a design for testability structure configured such that all registers at the same level have associated therewith a corresponding independently controllable clock signal.

9. The method of claim 6 wherein the partitioned clock signals are applied to the levels in the form of a clocking sequence comprising a plurality of clock pulses, with a first one of the clock pulses being applied to a first one of the levels, then a second one of the clock pulses being applied to a second one of the levels, . . . and then a final one of the clock pulses being applied to a final one of the levels, such that a given one of the applied test patterns propagates through the circuit.

10. The method of claim 9 wherein the given applied test pattern is kept constant for $d+1$ clock cycles, with cycle $d+1$ being used to allow changes in level-$d$ registers to propagate to primary outputs of the circuit.

11. The method of claim 4 wherein the design for testability structure comprises a circular shift register for generating $d+1$ clock signals each being applied to a corresponding one of $d+1$ levels, where $d$ is the sequential depth of the circuit.

12. The method of claim 4 wherein the design for testability structure further comprises logic circuitry including at least one of level selection circuitry and group selection circuitry, the level selection circuitry configured for selecting a particular one of the levels for receiving a corresponding one of the clock signals, the group selection circuitry configured for selecting a particular group of registers within a given one of the levels for receiving a corresponding one of the clock signals, the group selection circuitry thereby allowing further partitioning of the registers of the circuit within a given level.

13. The method of claim 12 wherein the group selection circuitry of the design for testability structure is implemented using $G$ additional primary inputs of the circuit, where $G$ is the maximum number of groups at any level.

14. The method of claim 12 wherein the group selection circuitry of the design for testability structure is implemented using a plurality of additional registers $EG_{ij}$, each of the registers $EG_{ij}$ storing an enable value for a corresponding group $j$ at level $i$.

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

15. The method of claim 1 wherein the generating step further comprises a first processing step which detects target faults in a single time frame, and a second processing step which detects target faults in two or more time frames.

16. The method of claim 15 wherein the generating step after targeting all potentially detectable faults in the single time frame via the first processing step proceeds in the second processing step to target all potentially detectable faults in $k$ time frames, where $k$ is initially set to a value of two for a first iteration of the second processing step and is incremented for a subsequent iteration of the second processing step only when no faults are detected in the previous iteration of the second processing step.

17. The method of claim 1 wherein at least one of the configuring step and the generating step is implemented at least in part in a processor-based device which is external to the circuit.

18. The method of claim 1 wherein at least one of the configuring step and the generating step is implemented at least in part in a processor-based device which is embedded within the circuit in a built-in self-test (BIST) configuration.

19. An apparatus for testing a circuit comprising a plurality of registers, the apparatus comprising:
a processor-based device operative to configure the circuit via a design for testability structure such that substantially all feedback loops associated with the registers, other than one or more self-loops each associated with a corresponding one of the registers, are broken, and to generate test patterns for application to the circuit, the test patterns being applied to the circuit in conjunction with partitioned clock signals each of which is associated with a corresponding portion of the circuit containing at least one of the self-loops.

20. An apparatus for testing a circuit comprising a plurality of registers, the apparatus comprising:
means for configuring the circuit such that substantially all feedback loops associated with the registers, other than one or more self-loops each associated with a corresponding one of the registers, are broken; and
means for generating test patterns for application to the circuit, the test patterns being applied to the circuit in conjunction with partitioned clock signals each of which is associated with a corresponding portion of the circuit containing at least one of the self-loops.

UNITED STATES PATENT AND TRADEMARK OFFICE
CERTIFICATE OF CORRECTION

| | |
|---|---|
| PATENT NO. | : 7,017,096 B2 |
| APPLICATION NO. | : 10/106960 |
| DATED | : March 21, 2006 |
| INVENTOR(S) | : Abramovici et al. |

It is certified that error appears in the above-identified patent and that said Letters Patent is hereby corrected as shown below:

21. An article of manufacture comprising a storage medium containing one or more software programs for use in testing a circuit comprising a plurality of registers, wherein the one or more software programs when executed by a processor implement the steps of:

configuring the circuit such that substantially all feedback loops associated with the registers, other than one or more self-loops each associated with a corresponding one of the registers, are broken; and generating test patterns for application to the circuit, the test patterns being applied to the circuit in conjunction with partitioned clock signals each of which is associated with a corresponding portion of the circuit containing at least one of the self-loops.

This certificate supersedes the Certificate of Correction issued March 25, 2008.

Signed and Sealed this

Twenty Second Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,017,096 B2
APPLICATION NO. : 10/106960
DATED : March 21, 2006
INVENTOR(S) : Abramovici et al.

It is certified that error appears in the above-identified patent and that said Letters Patent is hereby corrected as shown below:

Please delete entire patent title page, drawings 1-7, and columns 1 line 1 and columns 14 line 7

And insert title page, drawings 1 – 8, and columns 1 line 1 and columns 14 line 24 as shown on the attached pages.

Signed and Sealed this

Thirteenth Day of May, 2008

JON W. DUDAS
*Director of the United States Patent and Trademark Office*

(12) United States Patent
Abramovici et al.

(10) Patent No.: US 7,017,096 B2
(45) Date of Patent: Mar. 21, 2006

(54) SEQUENTIAL TEST PATTERN GENERATION USING CLOCK-CONTROL DESIGN FOR TESTABILITY STRUCTURES

(75) Inventors: Miron Abramovici, Berkeley Heights, NJ (US); Xiaoming Yu, Champaign, IL (US)

(73) Assignee: Agere Systems Inc., Allentown, PA (US)

(*) Notice: Subject to any disclaimer, the term of this patent is extended or adjusted under 35 U.S.C. 154(b) by 490 days.

(21) Appl. No.: 10/106,960

(22) Filed: Mar. 26, 2002

(65) Prior Publication Data
US 2003/0188245 A1 Oct. 2, 2003

(51) Int. Cl.
*G06F 11/00* (2006.01)
*G01R 31/28* (2006.01)

(52) U.S. Cl. .................... 714/738; 714/726

(58) Field of Classification Search ............. 714/744, 714/724, 733, 726, 738, 742, 728; 327/291; 377/29; 340/506
See application file for complete search history.

(56) References Cited

U.S. PATENT DOCUMENTS

| | | | |
|---|---|---|---|
| 3,812,337 A * | 5/1974 | Crosley | 714/811 |
| 4,331,952 A * | 5/1982 | Galvin et al. | 340/508 |
| 5,519,713 A * | 5/1996 | Baeg et al. | 714/724 |
| 5,559,811 A | 9/1996 | Abramovici et al. | |
| 5,566,187 A | 10/1996 | Abramovici et al. | |
| 5,590,135 A | 12/1996 | Abramovici et al. | |
| 5,625,630 A | 4/1997 | Abramovici et al. | |
| 5,805,608 A * | 9/1998 | Baeg et al. | 714/726 |
| 6,515,530 B1 * | 2/2003 | Boerstler et al. | 327/291 |
| 6,691,266 B1 * | 2/2004 | Winegarden et al. | 714/724 |
| 6,728,917 B2 * | 4/2004 | Abramovici et al. | 714/744 |

OTHER PUBLICATIONS

J. Shin et al., "At-Speed Logic BIST Using a Frozen Clock Testing Strategy," Proceedings International Test Conference (ITC), Paper 3.2, pp. 64-71, 2001.
U.S. Appl. No. 09/780,861, filed Feb. 9, 2001, M. Abramovici et al., "Sequential Test Pattern Generation Using Combinational Techniques.".
Y. Bertrand et al., "Multiconfiguration Technique to Reduce Test Duration for Sequential Circuits," International Test Conference, pp. 989-997, 1993.
M. Abramovici et al., "SMART and Fast: Test Generation for VLSI Scan-Design Circuits," IEEE Design & Test, pp. 43-54, 1986.
M. Abramovici et al., "FREEZE!: A New Approach for Testing Sequential Circuits," Proc. 29th Design Automation Conf., pp. 22-25, Jun. 1992.

(Continued)

*Primary Examiner*—Shelly Chase
*Assistant Examiner*—Mujtaba Chaudry

(57) ABSTRACT

Techniques for testing a sequential circuit comprising a plurality of flip-flops or other types of registers. The circuit is first configured such that substantially all feedback loops associated with the registers, other than one or more self-loops each associated with a corresponding one of the registers, are broken. Test patterns are then generated for application to the circuit. The test patterns are applied to the circuit in conjunction with partitioned clock signals each of which is associated with a corresponding level of the circuit containing at least one of the self-loops.

21 Claims, 8 Drawing Sheets

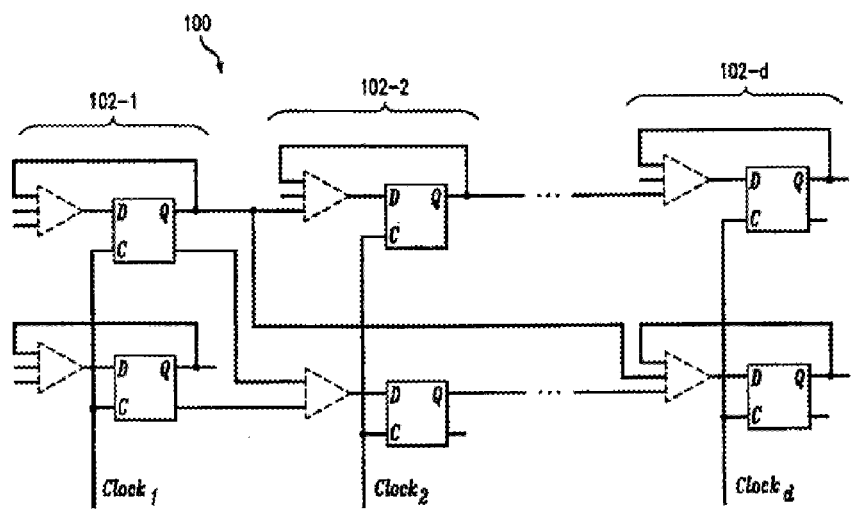

OTHER PUBLICATIONS

Y. Santoso et al., "FreezeFrame: Compact Test Generation Using a Frozen Clock Strategy," Proc. Design Automation and Test in Europe Conf., 6 pages, Mar. 1999.

V. D. Agrawal et al., "Design for Testability and Test Generation with Two Clocks," Proc. 4th Int'l. Symp. on VLSI Design, pp. 112-117, Jan. 1991.

K.L. Einspahr et al., "Clock Partitioning for Testability," Proc. 3rd IEEE Great Lakes Symp. on VLSI, pp. 42-46, Mar. 1993.

K.L. Einspahr et al., "Improving Circuit Testability by Clock Control," Proc. 6th IEEE Great Lakes Symposium on VLSI, pp. 288-293, Mar. 1996.

K.L. Einspahr et al., "A Synthesis for Testability Scheme for Finite State Machines Using Clock Control," IEEE Transactions on CAD, vol. 18, No. 12, pp. 1780-1792, Dec. 1999.

S.H. Baeg et al., "A New Design for Testability Method: Clock Line Control Design," Proc. Custom Integrated Circuits Conf., pp. 26.2.1-26.2.4, 1993.

K.B. Rajan et al., "Increasing Testability by Clock Transformation (Getting Rid of Those Darn States)," Proc. VLSI Test Symp., pp. 1-7, Apr. 1996.

R. Gupta et al., "The Ballast Methodology for Structured Partial Scan Design," IEEE Trans. on Computers, vol. 39, No. 4, pp. 538-544, Apr. 1990.

T.M. Niermann et al., "PROOFS: A Fast, Memory-Efficient Sequential Circuit Fault Simulator," IEEE Trans. CAD, vol. 11, No. 2, pp. 198-207, Feb. 1992.

T.P. Kelsey et al., "An Efficient Algorithm for Sequential Circuit Test Generation," IEEE Trans. on Computers, vol. 42, No. 11, pp. 1361-1371, Nov. 1993.

M.A. Iyer et al., "Identifying Sequential Redundancies Without Search," Proc. 33rd Design Automation Conf., pp. 457-462, Jun. 1996.

D.E. Long et al., "FILL and FUNI: Algorithms to Identify Illegal States and Sequentially Untestable Faults," ACM Trans. on Design Automation of Electronic Systems, 27 pages, Jul. 2000.

I. Hamzaoglu et al.,"New Techniques for Deterministic Test Pattern Generation," Proc. VLSI Test Symp, pp. 446-452, 15 pages, Apr. 1998.

* cited by examiner

FIG. 6
(a)
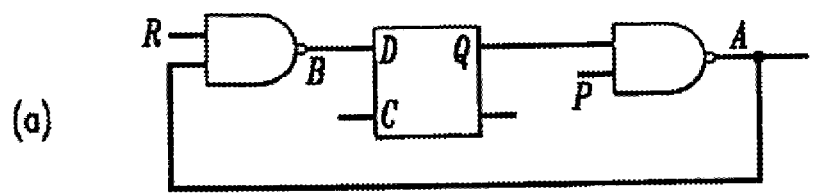
(b)
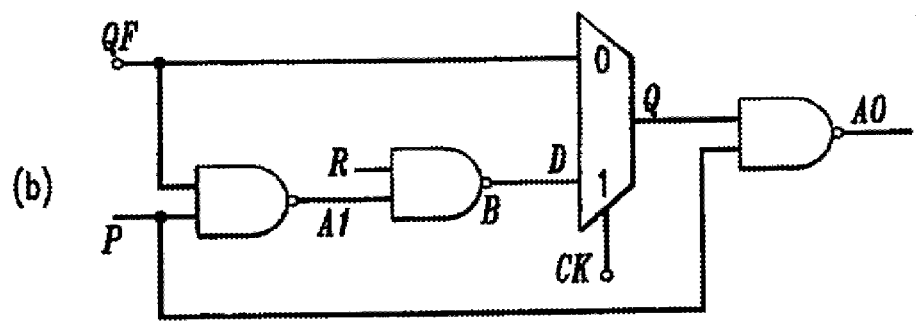
FIG. 7

SEQUENTIAL TEST PATTERN GENERATION USING CLOCK-CONTROL DESIGN FOR TESTABILITY STRUCTURES

FIELD OF THE INVENTION

The present invention relates generally to the design and testing of integrated circuits and other complex electronic circuits, and more particularly to techniques for generating test patterns for use in testing such circuits.

BACKGROUND OF THE INVENTION

Automatic test pattern generation (ATPG) for sequential circuits is an extremely expensive computational process. ATPG algorithms working on complex sequential circuits can spend many hours of central processing unit (CPU) time and still obtain poor results in terms of fault coverage. There are a number of factors that contribute to the difficulty of the ATPG process for sequential circuits. For example, it is generally necessary for an ATPG algorithm to use a model that includes an iterative array of time frames, where the number of time frames may be, in the worst case, an exponential function of the number of flip-flops (FFs) in the circuit. In addition, an ATPG algorithm may waste a substantial amount of time trying to justify illegal states. Furthermore, an ATPG algorithm typically must complete an exhaustive search for each target fault that is to be identified as untestable. Another difficulty is controlling and observing so-called "buried" FFs of the sequential circuit.

Because of the above-noted difficulties associated with sequential ATPG, complex sequential circuits are generally tested using design for testability (DFT) techniques, such as scan design, which significantly change the structure of a given circuit so as to make its buried FFs more controllable and observable in test mode. However, scan-type DFT techniques introduce delay penalties that result in performance degradation, and substantially increase circuit area overhead thereby increasing power consumption and decreasing yield. In addition, scan-type DFT techniques are not directly compatible with at-speed testing.

U.S. patent application Ser. No. 09/780,861, filed Feb. 9, 2001 and entitled "Sequential Test Pattern Generation Using Combinational Techniques," which is incorporated by reference herein, describes techniques for performing ATPG for sequential circuits in a more efficient manner, so as to alleviate the problems associated with conventional ATPG, while also avoiding the problems associated with existing DFT techniques such as scan design.

Despite the considerable advancements provided by the techniques described in the above-cited U.S. patent application, a need remains for further improvements in the testing of sequential circuits using ATPG.

SUMMARY OF THE INVENTION

In accordance with one aspect of the invention, test pattern generation is performed for a sequential circuit comprising a plurality of flip-flops or other types of registers. The circuit is first configured such that substantially all feedback loops associated with the registers, other than one or more self-loops each associated with a corresponding one of the registers, are broken. Test patterns are then generated for application to the circuit. The test patterns are applied to the circuit in conjunction with partitioned clock signals each of which is associated with a corresponding portion of the circuit containing at least one of the self-loops.

By way of example, the feedback loops of the circuit may include global loops, each comprising two or more registers, and self-loops, each comprising a single register. In this case, all of the global loops may be broken, with a given one of the global loops being broken by temporarily freezing a clock signal associated with at least one register in the given global loop. As another example, the sequential circuit may already be configured such that the feedback loops of the circuit include only self-loops, each comprising a single register. In this case, configuring the circuit for testing need not involve the breaking of any feedback loops of the circuit.

In an illustrative embodiment, a design for testability (DFT) structure is used to provide partitioning of a master clock into multiple clock signals each associated with a corresponding one of the levels of self-loops, so as to permit breaking of the feedback loops other than the self-loops. The registers of the circuit may be arranged in the particular levels by assigning a first one of the levels to each register which is fed only by primary inputs (PIs) of the circuit, and then assigning to level i+1 every register that is fed by other registers whose maximum level is i, where $i = 1, 2, \ldots, d$, and d is the sequential depth of the circuit. The partitioned clock signals may be generated by the DFT structure such that all registers at the same level have associated therewith a corresponding independently controllable clock signal. The partitioned clock signals are preferably applied to the levels in the form of a "clock wave," which illustratively may be a clocking sequence comprising a plurality of clock pulses, with a first one of the clock pulses being applied to a first one of the levels, then a second one of the clock pulses being applied to a second one of the levels, and so on until a final one of the clock pulses is applied to a final one of the levels, such that a given one of the applied test patterns propagates through the circuit. A given applied test pattern is preferably kept constant for d+1 clock cycles, with cycle d+1 being used to allow changes in level-d registers to propagate to primary outputs of the circuit.

In accordance with another aspect of the invention, each of the levels of registers may have multiple groups of registers associated therewith, with each of the groups being subject to clocking by one of the partitioned clock signals through the operation of group selection circuitry. The DFT structure in this case may include level selection circuitry and group selection circuitry, with the level selection circuitry configured for selecting a particular one of the levels for receiving a corresponding one of the clock signals, and the group selection circuitry configured for selecting a particular group of registers within a given one of the levels for receiving a corresponding one of the clock signals. The group selection circuitry thus allows further partitioning of the registers of the circuit within a given level. The group selection circuitry of the DFT structure may be implemented using G additional primary inputs of the circuit, where G is the maximum number of groups at any level, or by using a plurality of additional registers $EG_{ij}$, each of the registers $EG_{ij}$ storing an enable value for a corresponding group j at level i.

An ATPG process in accordance with a further aspect of the invention includes a first processing step which detects target faults in a single time frame, and a second processing step which detects target faults in two or more time frames. After targeting all potentially detectable faults in the single time frame via the first processing step, the process in the second processing step targets all potentially detectable faults in k time frames, where k is initially set to a value of two for a first iteration of the second processing step. The value of k is incremented for a subsequent iteration of the second processing step only when no faults are detected in the previous iteration of the second processing step.

Advantageously, the test pattern generation process of the present invention addresses the above-described problems associated with conventional testing of sequential circuits without requiring a scan-type DFT approach that significantly changes the circuit configuration in test mode. The DFT structures utilized in the illustrative embodiments introduce no delay penalties and only a small area overhead, and are compatible with at-speed testing.

BRIEF DESCRIPTION OF THE DRAWINGS

Figure 12:
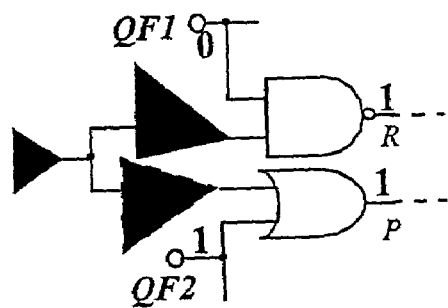
FIG. 12 illustrates example faults that may be removed from a current set of target faults in the FIG. 8 process.

FIG. 1 shows a portion of a sequential circuit configured as a loopy pipe with partitioned clocks in accordance with the techniques of the invention;

FIGS. 2A and 2B show example clock-control design for testability (DFT) structures in accordance with illustrative embodiments of the invention;

FIG. 3 is a timing diagram for the FIG. 2B clock-control DFT structure for an example loopy pipe with a sequential depth of d=4;

FIG. 4 shows a model for an example self-loop flip-flop in accordance with the invention;

FIG. 5 shows a combinational model of an example sequential circuit for a single time frame in accordance with the invention;

FIG. 6 illustrates the processing of a fault associated with a duplicated circuit line in accordance with the invention;

FIG. 7 shows a model for an example stuck-at-zero fault suitable for use in accordance with the invention;

FIG. 8 is a flow diagram of an example test pattern generation process for use in testing a sequential circuit having the clock-control DFT structure of FIG. 5A or FIG. 5B;

FIG. 9 shows a combinational model for an example series of separated time frames in accordance with the invention;

FIG. 10 shows a combinational model for an example series of connected time frames in accordance with the invention;

FIG. 11 illustrates the manner in which the test pattern generation process of FIG. 8 sets clock values in testing a sequential circuit having the clock-control DFT structure of FIG. 5A or FIG. 5B;

FIG. 12 illustrates example faults that may be removed from a current set of target faults in the FIG. 8 process;

FIG. 13 shows an example circuit and corresponding state diagram illustrating an undetectable fault; and FIG. 14 shows a block diagram of a test configuration in which the invention may be implemented.

DETAILED DESCRIPTION OF THE INVENTION

The present invention will be illustrated herein using exemplary sequential circuits. It should be understood, however, that the techniques of the invention can be applied to any desired type of sequential circuit. The term "register" as used herein is intended to include any arrangement of one or more flip-flops (FFs) or other circuit storage elements. The term "freezing" as used herein in conjunction with a clock signal refers to any technique for interrupting or otherwise stopping the clock signal.

The present invention provides improved techniques for performing automatic test pattern generation (ATPG) that are particularly well-suited for use with sequential circuits. More particularly, the invention in the illustrative embodiments to be described provides improved design for testability (DFT) structures and a corresponding ATPG process. Advantageously, the DFT structures of the present invention do not introduce any significant delay penalty, have a very small area overhead and are compatible with at-speed testing. The corresponding ATPG process operates in conjunction with the DFT structures of the invention to provide improved testing of sequential circuits.

In a sequential circuit, a given feedback loop may be local or global. A local loop includes only one FF and is also called a self-loop. Any loop with two or more FFs is called a global loop. A pipeline is a loop-free or acyclic sequential circuit.

The present invention in the illustrative embodiments uses the above-noted clock-control DFT structures to temporarily freeze a subset of sequential circuit FFs so as to break all global loops. This creates a near-acyclic circuit in which every FF is either feedback-free or has a self-loop. This near-acyclic circuit is referred to herein as a "loopy pipe," since it has a pipeline structure if the self-loops are ignored. Because loopy pipes do not have global feedback, they are structurally simpler than sequential circuits with both local and global feedback. Conventional ATPG techniques are generally not well-suited for use with sequential circuits that are configurable as loopy pipes. The present invention, however, provides ATPG techniques that can handle loopy pipes in a particularly efficient manner. For example, the invention uses clock-control DFT structures to generate what are referred to herein as "clock waves." A clock wave is a novel clocking technique that allows a loopy pipe to be tested as a pipeline, such that efficient combinational ATPG techniques may be used in testing a sequential circuit. It has been shown, for example, in R. Gupta et al., "The Ballast Methodology for Structured Partial Scan Design," IEEE Trans. on Computers, Vol. 39, No. 4, pp. 538–544, Apr. 1990, that test generation in a pipeline circuit can be done by combinational techniques.

FIG. 1 shows a portion of a sequential circuit 100 configured as a loopy pipe with partitioned clocks in accordance with the techniques of the invention. The portion of the sequential circuit 100 shown in the figure includes d groups of D-type FFs denoted 102-1, 102-2, ... 102-d, with each of the FFs in a given group being clocked by a corresponding clock signal $Clock_1$, $Clock_2$, ... $Clock_d$. It should be appreciated that the FIG. 1 circuit is simplified for illustrative purposes, and that the circuit may include other logic circuitry not explicitly shown. The loopy pipe is configured by first building for each of the FFs its corresponding "data cone" comprising all of the logic circuitry feeding its D input. The data cone may be built by tracing back from the D input of a given FF and stopping at primary inputs (PIs) and FF outputs. The data cones are shown illustratively as dashed triangles at the D inputs of the FFs in FIG. 1.

Since a loopy pipe has no global feedback, it is possible to arrange the FFs in levels if the self-loops are ignored. In this example, level 1 is assigned to every FF fed only by PIs, and every FF fed by FFs whose maximum level is i is assigned level i+1. The highest level d is the sequential depth of the loopy pipe. The DFT structures to be described below in conjunction with FIGS. 2A and 2B provide clock partitioning such that all FFs at the same level i have a corresponding independent clock $Clock_i$ as in the FIG. 1 loopy pipe example.

In the illustrative embodiments, a loopy pipe such as that shown in FIG. 1 is tested by keeping a given applied PI vector constant while applying the above-noted clock wave to the partitioned clocks. The clock wave in these embodiments is in the form of a sequence that applies a pulse to $Clock_1$, then to $Clock_2$, ..., and eventually to $Clock_d$. In this way the applied PI vector propagates throughout the circuit, with every FF being clocked only once. The applied PI vector is preferably kept constant for $d+1$ clock cycles, with cycle $d+1$ being used to allow the changes in the level-d FFs to propagate to primary outputs (POs).

FIG. 2A shows an example clock-control DFT structure that may be utilized in conjunction with a loopy pipe with d levels embedded in a sequential circuit 200. The loopy pipe includes level 1 through level d FF circuits denoted 202-1 through 202-d, although of these only the circuit 202-1 is explicitly shown. The circuit 200 further includes a frozen register 204, which in this example is treated as an additional FF circuit at level $d+1$. The DFT structure in this example comprises logic circuitry 210 in conjunction with clock-enabling AND gates in the FF circuits 202 and in the frozen register 204.

Assume initially that PIs $EG_1$ and $EG_2$ are configured such that $EG_1=EG_2=1$. All the FFs at level i are enabled by the same enable level signal $EL_i$. In normal mode, N_Mode=1, so that all $EL_i$ signals are active, and the main clock Mclock propagates to all FFs. In test mode, N_Mode=0, and the clock propagation is under the control of $d+1$ enabling signals $EN_n$, generated by a circular shift register with $d+1$ FFs in logic circuitry 210. The initial state in the circular shift register is 10 ... 0, so that one level at a time will be enabled in the proper sequence. The shift register is clocked by a different phase of the main clock, i.e., a clock signal denoted MClock1. An enable group j signal $EG_j$ allows further clock partitioning of the FFs at the same level i. The enable value for group j at level i is $EV_{ij}=EL_i*EG_j$. The timing of MClock1 is determined so that the EV values will be stable before the arrival of the next MClock pulse.

The FIG. 2A clock-control DFT structure includes two groups at each level, with only one FF being shown in each group. For example, FF circuit 202-1 includes a first group 212-1 and a second group 214-1. While normal PIs of the circuit 200 are kept constant for $d+1$ clock cycles, the $EG_j$ signals may change before every clock pulse. The $EG_j$ signals can thus be shared among all levels, because the levels are clocked one by one. Hence, in every cycle the $EG_j$ signals determine the clock partition for a different level. In normal mode, all $EG_j$ signals are always set to 1. The same mechanism is used to hold the state of the frozen register 204 for several clock waves, by setting all $EG_j$ signals to 0 in the $d+1$ cycle. Note that even when the frozen state is not changed, cycle $d+1$ is used to observe POs.

Although it is possible to reduce the hardware requirements in the clock-control DFT structure of FIG. 2A by having only one AND gating MClock for all the FFs in the same group, such an arrangement may result in clock skewing. By having clock gating within every FF as shown in FIG. 2A, the clock distribution path to the FFs, i.e., the routing of MClock, is the same in both the normal mode and in the test mode, such that the DFT structure will not cause clock skewing.

It is apparent from the foregoing description that the clock-control DFT structure of FIG. 2A requires G additional PIs, where G is the maximum number of groups needed at any level. However, there may be circuit applications in which G spare PIs are not available. For these and other applications, the DFT structure of FIG. 2B may be preferred.

FIG. 2B shows an alternative clock-control DFT structure for implementation in a sequential circuit 225 in accordance with the invention. The DFT structure in this example comprises logic circuitry 230 in conjunction with clock-enabling AND gates in each of the $d+1$ levels, e.g., the FF circuits 202 and in the frozen register 204. Only one FF circuit 202-i, i=1, 2, ..., $d+1$, is explicitly shown, but it is assumed that the FF circuits are arranged as in FIG. 2A, and include frozen register 204. Each FF circuit 202-i and the frozen register 204 is assumed in this example to include corresponding first and second groups 212-i and 214-i, respectively.

This DFT structure needs no additional PIs but requires additional FFs $EG_{ij}$ to store the enable values for every group j at every level i. These additional FFs must be set before a given clock wave starts, so they are treated as an additional level 0, which may be obtained by adding another FF, e.g., a FF denoted $EN_0$ to the circular shift register of FIG. 2A. Data values for the $EG_{ij}$ FFs may be supplied by "normal" or regular PIs. This is possible because MClock does not reach any functional FF when the level-0 FFs are enabled. The DFT structure of FIG. 2B can provide a large number of enabling signals without additional PIs. In the normal mode, the $EG_{ij}$ FFs are always set to 1.

FIG. 3 is a timing diagram illustrating the relation between MClock cycles and the PIs, for a sequential circuit having a frozen register and a loopy pipe with d=4, using the DFT structure of FIG. 2B. Each applied PI vector is held for cycles 1 to 5. MCLOCK pulse 0 loads the $EG_{ij}$ FFs, and MCLOCK pulse 5 is for the frozen register 204. The POs are observed after MCLOCK pulse 4. In addition to the increase in testability caused by reducing the correlation among FFs sharing the same clock, the second level of clock partitioning described above provides a dynamic freeze capability. This dynamic freeze capability allows an automatic test pattern generator to hold the state of a given FF as long as it needs to, by simply not clocking it. This is especially useful when different fault effects have been propagated to that FF.

For a circuit with n FFs in the FF circuits 202 and 204, the main component of the area overhead associated with the DFT structures of FIGS. 2A and 2B is the n clock-enabling AND gates, but this area overhead is significantly less than the area overhead typically associated with a conventional scan design. In addition, there are $d+1$ FFs and $d+1$ OR gates used for generation of the above-described clock wave. If $G_i$ is the number of clock groups at level i, then for the DFT structure of FIG. 2A, $G=\max\{G_i\}$ PIs are needed, while for the DFT structure of FIG. 2B, $G_i$ FFs and $G_i$ AND gates are needed at every level i. However, the total number of FFs and other gates required for clock control is generally much smaller than n, so the total area overhead will still be substantially less than that required for scan design.

An important advantage of the DFT structures of FIGS. 2A and 2B is that the operating frequency of the sequential circuit is not affected by the clock control mechanism, since no delays are introduced in data paths. Unlike scan design, the above-described clock-control DFT structures are fully compatible with at-speed testing. Compared to scan-based tests, tests implemented using the techniques of the present invention generally have much shorter test application times and consume much less power, because scan operations are not performed, and only a subset of the FFs are concurrently clocked.

FIG. 4 shows a combinational model of a self-loop FF, suitable for use in conjunction with the invention. The left side of the figure shows a given one of the self-loop FFs from the loopy pipe of FIG. 1. The right side shows a corresponding model to be utilized in the ATPG process of the invention. In the model, the clock is treated as a regular PI: CK=1 denotes the application of a clock pulse that transfers the D input into the new state Q, while CK=0 means that a clock pulse is not applied, so the FF holds its previous state QF, represented by an additional PI. Note that QF may also influence Q through the data cone, again illustrated as a dashed triangle at the D input, reflecting the effect of the feedback loop.

In the FIG. 4 model, QF is modeled as a frozen PI, so that the ATPG process to be described below will not be allowed to change its value. If the process starts with QF=X, where X denotes an unknown initial state, and the process then needs Q set to a binary value, this model will force the process to set CK=1 and to assign other inputs of the data cone to values that allow the FF to be initialized.

The same model, not necessarily including the QF to D connection, may be used for all FFs in the FF circuits 202 and frozen register 204. For frozen FFs, one can set CK=0, and for transparent FFs one can set CK=1. This will result in a combinational circuit as shown in FIG. 5, which will serve herein as a model for a single time frame. The frozen PIs carrying the previous state of internal FFs are denoted as QFIs, and are distinguished from those PIs that carry the state of the frozen register, which are denoted QFFs. Clocks are modeled as independent PIs. The figure shows only one clock per level, but it is to be appreciated that there may be multiple such clocks at every level. The combinational model of FIG. 5 is possible because every internal FF is clocked at most once during a clock wave. The combinational vector generated in the corresponding single time frame is kept constant while the clock wave is applied. It should be noted that the single time frame in this model corresponds to d+1 conventional time frames.

In order to make faults from any "invisible" logic also observable within the above-noted single time frame, without clocking the frozen register, the model of FIG. 5 includes an additional PO, denoted APO, that observes all the inputs of the frozen register via an XOR tree. This technique is used to improve observability, is independent of clock control, has negligible impact on timing, and is compatible with at-speed testing. Additional details regarding similar techniques can be found in J. R. Fox, "Test-Point Condensation in the Diagnosis of Digital Circuits," Proc. of IEE, Vol. 124, No. 2, pp. 89–94, February 1977, which is incorporated by reference herein.

FIG. 6 illustrates the processing of a fault associated with a duplicated circuit line in accordance with the invention. In part (a) of the figure, gate A is in the data cone of the FF but also on any forward path from Q to a PO. Because the FIG. 4 model breaks the feedback loop at Q, such a gate should be duplicated so that one copy is in the data cone and the other in a fanout cone of Q. In part (b) of the figure, A1 is the "back" copy of gate A, and A0 is the "forward" copy of gate A. In a case in which a gate appears in the data cones and the fanout cones of two self-loop FFs, the gate will be duplicated only once when building the model.

For any single stuck-at fault in the original circuit, the equivalent fault is preferably injected in the combinational model used for automatic test pattern generation. If the fault resides on a line that is duplicated, a multiple stuck-at fault is injected in the combinational model to generate a valid test pattern. For example, if the fault being targeted is output A being stuck-at-one (s-a-1) in the circuit shown in part (a) of FIG. 6, the multiple stuck-at fault {A0 s-a-1, A1 s-a-1} should be injected in the model in part (b) of FIG. 6. In a case in which the fault effect on the back copy can be propagated only through the forward copy of the same line, only the single fault on the forward copy is sufficient, which is the case in the FIG. 6 example.

Fault injection may be implemented, by way of example, using a fault simulator such as the PROOFS fault simulator described in T. M. Niermann et al., "PROOFS: A Fast, Memory-Efficient Sequential Circuit Fault Simulator," IEEE Trans. CAD, vol. 11, no. 2, pp. 198–207, Feb., 1992, which is incorporated by reference herein.

FIG. 7 shows a model for an example stuck-at-zero (s-a-0) fault. The s-a-0 fault is shown between nodes A and B on the left side of the figure. In the model, shown on the right side of the figure, the second input of an AND gate inserted between nodes A and B is set to a frozen composite value 1/0 to keep the fault effect. In this way, just trying to propagate the fault effect would involve setting A=1, which is also the condition for activating the fault effect in the real circuit. Similarly, an OR gate may be used for modeling a stuck-at-one (s-a-1) fault between A and B.

FIG. 8 is a flow diagram of an illustrative ATPG process in accordance with the invention, for testing a sequential circuit having a clock-control DFT structure as described in conjunction with FIG. 2A or 2B, utilizing the modeling techniques described in conjunction with FIGS. 4, 5, 6 and 7. The illustrative ATPG process of FIG. 8 is also referred to herein as WAVEXPRESS and comprises an opportunistic algorithm that tries to detect all detectable faults with minimal computational effort. Unlike most conventional ATPG algorithms, which work on a selected target until it is detected or proven untestable, WAVEXPRESS abandons the current target if it cannot detect it quickly, and moves to other targets that may be easier to detect in the current state.

As shown in step 800 of FIG. 8, the WAVEXPRESS algorithm starts with a single time frame, and tries to detect as many faults as possible without changing the current frozen state. Before targeting faults, WAVEXPRESS analyzes the set of targets and eliminates many faults whose detection is not possible given the currently frozen PI values. After all potentially detectable faults have been targeted within a single time frame, WAVEXPRESS switches to a model with k time frames, starting with k=2, as indicated in steps 802 and 804. After the first fault is detected using a sequence of k vectors, WAVEXPRESS reverts to the single time frame loop, i.e., the loop around step 800, with a new state of the frozen register. The number of time frames k is increased in step 806 only when not even one fault could be detected with k time frames.

All assignable PIs, including clocks, start with an unknown logic value. If WAVEXPRESS detects the selected target fault, every generated vector is expanded into a sequence of d+1 identical vectors and their associated clock wave. The values of the clock PIs are mapped into settings for the $EV_{ij}$ signals described previously. Clocks left unassigned are not activated, to save power and if possible to preserve fault effects stored in internal FFs. Any unassigned PIs are set to random binary values. The resulting sequence is preferably fault simulated using, e.g., the above-noted PROOFS fault simulator.

Note that in the test generation model, the POs are observed only after the d-level FFs have been clocked, but in the fault simulation model they are observed after every clock. This is equivalent to applying several random vectors in between the generated vectors, and these vectors may detect additional faults. The results of the PROOFS fault simulator are ported back into the WAVEXPRESS ATPG algorithm to enable fault dropping and reporting of stored fault effects. The ATPG algorithm and the fault simulator may be implemented as separate software programs which communicate via conventional sockets, as will be appreciated by those skilled in the art.

FIG. 9 illustrates the operation of the first loop of WAVEXPRESS, i.e., the loop around step 800, showing two consecutive time frames. After a vector is generated in the first time frame on the left side of the figure, the changed values of internal FFs are propagated to the QF1 inputs of the next time frame, shown on the right side of the figure, before a new fault is targeted. These values are frozen for ATPG. Except for this value transfer, denoted by the dotted line from the left side to the right side of the figure, consecutive time frames are not connected, so WAVEXPRESS works separately with each time frame in this first loop. The values of frozen register QFFs are the same in every time frame.

FIG. 10 depicts a model with two time frames, used in step 804 of FIG. 8 after all targets have been tried with one time frame. The previously frozen register is now allowed to change, and its clock (Clock$_{i+1}$) is now an assignable PI in the first time frame. No inputs are frozen in the second time frame, as every QF input is connected with its corresponding Q output from the first time frame. All POs in the first time frame are ignored, since none of the remaining targets could be detected at these POs. Similarly, in a model with k time frames, all POs in the first k−1 time frames are ignored.

Although WAVEXPRESS backtraces objectives to PIs, it is advantageously configured to avoid backtracing toward the PIs with frozen values. Backtracing can span multiple time frames. Since decisions are done only as PI assignments, WAVEXPRESS does not do explicit state justification, and it never has to justify illegal states.

FIG. 11 illustrates how the WAVEXPRESS algorithm of FIG. 8 sets clock values. The circuit shown is a portion of a loopy pipe model containing two FFs with self-loops and initial states QF1=0 and QF2=1. Assume that QF2 carries some fault effects, and that WAVEXPRESS selects one of them as the next target. To propagate the fault effect to Q2 and Z, the algorithm must set CK2=0, which means that Q2 is not clocked, and A0=0. This in turn implies P=Q1=1. To set Q1=1 when the initial state QF1=0, CK1 must be 1, which shows that Q1 must be clocked.

A number of preprocessing steps may be used in conjunction with the FIG. 8 ATPG process. For example, the FIRES algorithm described in M. Iyer et al., "Identifying Sequential Redundancies Without Search," Proc. 33rd Design Automation Conf., June 1996, and the FUNI algorithm described in D. E. Long et al., "FILL & FUNI: Algorithms To Identify Illegal States and Sequentially Untestable Faults," ACM Trans. on Design Automation of Electronic Systems, July 2000, both of which are incorporated by reference herein, may be used to identify combinationally and sequentially untestable faults.

Other techniques for identifying untestable faults are described in U.S. Pat. No. 5,559,811, issued Sep. 24, 1996 and entitled "Method For Identifying Untestable & Redundant Faults In Sequential Logic Circuits," and U.S. Pat. No. 5,566,187, issued Oct. 10, 1996 and entitled "Method For Identifying Untestable Faults In Logic Circuits," both of which are incorporated by reference herein.

In addition, the combinational test pattern generator ATOM described in I. Hamzaoglu et al., "New Techniques for Deterministic Test Pattern Generation," Proc. VLSI Test Symp, pp. 446–452, April 1998, which is incorporated by reference herein, may be run on a full-scan model of the circuit to identify the rest of the combinationally untestable faults. Any untestable faults identified by these preprocessing operations are removed from the set of target faults used by the FIG. 8 process. These same faults would be much more computationally expensive to target in test generation.

Since the frozen PI values may preclude the activation or the observation of many still undetected faults, WAVEXPRESS removes these faults from the current set of target faults, so that only potentially detectable faults will be targeted. For example, in the circuit in FIG. 12, R s-a-1 and P s-a-1 cannot be activated, and no fault in the shaded areas can be observed.

Faults whose effects are stored in currently observable frozen or internal FFs are always included in the set of targets. Among these, priority is given to fault effects stored in internal FFs, since the application of a clock wave may change their state. The set of targets is incrementally updated after every clock wave.

WAVEXPRESS may make use of additional heuristics based on testability measures to select a target most likely to be detected in the current state. Such heuristics are well-known to those skilled in the art. It is also possible to enforce a limit on the number of times the same fault is going to be targeted.

It should be noted that a significant difference between using a sequence of k separated time frames as illustrated in FIG. 9 and an array of k connected time frames as illustrated in FIG. 10 is the size of the ATPG search space. For separated time frames, after one vector has been generated and the algorithm has advanced to the next time frame, there is no way to backtrack a decision taken in a previous time frame. However, this type of backtracking is possible in the connected time frames model. For m PIs, the search space in a single time frame comprises $2^m$ vectors. For k separated time frames, the combined search space is additive, leading to a total search space size of $k2^m$. For k connected time frames, the combined search space is multiplicative, for a total search space size of $2^{km}$. Hence the difference between the two cases increases exponentially with the number of time frames. Advantageously, the WAVEXPRESS algorithm detects most faults by separated time frames, which tends to reduce the size of the search space and thus the computational complexity of the algorithm.

It should also be noted that because clock partitioning of the type described above disables sequentially reconvergent fanout, it usually transforms some faults untestable in the original circuit into detectable faults. FIG. 13 shows an example circuit and corresponding state diagram addressing the issue of whether constraints introduced by clock wave testing can cause testable faults to become untestable. All four states shown in the state diagram are legal in this circuit, but having separated clocks for the two FFs makes state 01 unreachable, since the only transition leading to state 01 requires concurrent changes of both FFs. So any fault whose detection requires the illegal state would become untestable. In practice, however, this effect is usually negligible.

The FIG. 8 ATPG process may be implemented in a conventional personal computer, workstation or other processor-based system. For example, the process may be implemented as one or more software programs executed on a Pentium III computer with 256 Mb memory, a Sun SPARC Ultra-Enterprise computer, or other suitable processor-based system.

FIG. 14 shows one example of a test system in which the invention may be implemented. In this example, a circuit 1402 is coupled to a tester 1404. The tester 1404 supplies PIs and one or more clock signals to the circuit 1402 and observes the POs of the circuit 1402. The tester 1404 may be external to the circuit 1402 as shown in the figure or alternatively may be viewed as an embedded tester that is incorporated within the circuit 1402. In the case of an embedded tester, the combinational vectors may be randomly generated, and the tester can keep a given vector constant while applying clocks to transparent registers. This type of embedded tester is an example of a built-in self-test (BIST) implementation of the present invention.

The tester 1404 is preferably configured to apply test vectors generated by an ATPG software program running on a processor-based device coupled to the tester 1404. As a possible alternative implementation, the tester 1404 may itself be a computer or other processor-based device which implements a test pattern generator in accordance with the invention, and applies the resulting test vectors to the circuit 1402.

One or more software programs for implementing the test pattern generation process of FIG. 8 may be stored in a memory of a processor-based device coupled to the tester 1404 and executed by a processor of that processor-based device. In the alternative implementation noted above, such functions may be implemented at least in part within the tester 1404 itself.

The above-described embodiments of the invention are intended to be illustrative only. For example, alternative embodiments may be configured which utilize different DFT structures, different modeling techniques, and different ATPG process steps, as well as processing and test platforms other than those specifically described herein. In addition, although illustrated using a single clock domain, e.g., a partitioned clock signal arrangement in which multiple clock signals are derived from a related master clock, the techniques of the invention can also be applied to multiple clock domains. Furthermore, although illustrated using flip-flops, the invention can be implemented using other types of registers. As indicated above, the invention may be implemented at least in part in software, e.g., in one or more software programs stored on a computer-readable medium or other type of storage medium, and in various combinations of hardware and software. These and numerous other alternative embodiments within the scope of the following claims will be apparent to those skilled in the art.

What is claimed is:

1. A method of testing a circuit comprising a plurality of registers, the method comprising the steps of:
configuring the circuit such that substantially all feedback loops associated with the registers, other than one or more self-loops each associated with a corresponding one of the registers, are broken; and
generating test patterns for application to the circuit, the test patterns being applied to the circuit in conjunction with partitioned clock signals each of which is associated with a corresponding portion of the circuit containing at least one of the self-loops.

2. The method of claim 1 wherein the configuring step further comprises breaking a given one of the feedback loops other than the self-loops by temporarily freezing a clock signal associated with at least one register in the given one of the feedback loops.

3. The method of claim 1 wherein the feedback loops of the circuit include only self-loops each comprising a single register, such that the configuring step does not involve the breaking of any feedback loops of the circuit.

4. The method of claim 1 wherein the configuring step is implemented using a design for testability structure which provides partitioning of a master clock into multiple clock signals each associated with a corresponding one of a plurality of levels of self-loops so as to permit breaking of the feedback loops other than the self-loops.

5. The method of claim 1 wherein the registers of the circuit are arranged in a plurality of groups, with each of the registers in a given one of the groups being clocked by a corresponding clock signal.

6. The method of claim 1 wherein the registers of the circuit are arranged in levels by assigning a first one of the levels to each register which is fed only by primary inputs of the circuit, and then assigning to level i+1 every register that is fed by other registers whose maximum level is i, where i=1,2,...d, and d is the sequential depth of the circuit.

7. The method of claim 6 wherein each of at least a subset of the levels of the registers has multiple groups of registers associated therewith.

8. The method of claim 6 wherein the partitioned clock signals are generated utilizing a design for testability structure configured such that all registers at the same level have associated therewith a corresponding independently controllable clock signal.

9. The method of claim 6 wherein the partitioned clock signals are applied to the levels in the form of a clocking sequence comprising a plurality of clock pulses, with a first one of the clock pulses being applied to a first one of the levels, then a second one of the clock pulses being applied to a second one of the levels, ... and then a final one of the clock pulses being applied to a final one of the levels, such that a given one of the applied test patterns propagates through the circuit.

10. The method of claim 9 wherein the given applied test pattern is kept constant for d+1 clock cycles, with cycle d+1 being used to allow changes in level-d registers to propagate to primary outputs of the circuit.

11. The method of claim 4 wherein the design for testability structure comprises a circular shift register for generating d+1 clock signals each being applied to a corresponding one of d+1 levels, where d is the sequential depth of the circuit.

12. The method of claim 4 wherein the design for testability structure further comprises logic circuitry including at least one of level selection circuitry and group selection circuitry, the level selection circuitry configured for selecting a particular one of the levels for receiving a corresponding one of the clock signals, the group selection circuitry configured for selecting a particular group of registers within a given one of the levels for receiving a corresponding one of the clock signals, the group selection circuitry thereby allowing further partitioning of the registers of the circuit within a given level.

13. The method of claim 12 wherein the group selection circuitry of the design for testability structure is implemented using G additional primary inputs of the circuit, where G is the maximum number of groups at any level.

14. The method of claim 12 wherein the group selection circuitry of the design for testability structure is implemented using a plurality of additional registers $EG_{ij}$, each of the registers $EG_{ij}$ storing an enable value for a corresponding group j at level i.

15. The method of claim 1 wherein the generating step further comprises a first processing step which detects target faults in a single time frame, and a second processing step which detects target faults in two or more time frames.

16. The method of claim 15 wherein the generating step after targeting all potentially detectable faults in the single time frame via the first processing step proceeds in the second processing step to target all potentially detectable faults in k time frames, where k is initially set to a value of two for a first iteration of the second processing step and is incremented for a subsequent iteration of the second processing step only when no faults are detected in the previous iteration of the second processing step.

17. The method of claim 1 wherein at least one of the configuring step and the generating step is implemented at least in part in a processor-based device which is external to the circuit.

18. The method of claim 1 wherein at least one of the configuring step and the generating step is implemented at least in part in a processor-based device which is embedded within the circuit in a built-in self-test (BIST) configuration.

19. An apparatus for testing a circuit comprising a plurality of registers, the apparatus comprising:

a processor-based device operative to configure the circuit via a design for testability structure such that substantially all feedback loops associated with the registers, other than one or more self-loops each associated with a corresponding one of the registers, are broken, and to generate test patterns for application to the circuit, the test patterns being applied to the circuit in conjunction with partitioned clock signals each of which is associated with a corresponding portion of the circuit containing at least one of the self-loops.

20. An apparatus for testing a circuit comprising a plurality of registers, the apparatus comprising:

means for configuring the circuit such that substantially all feedback loops associated with the registers, other than one or more self-loops each associated with a corresponding one of the registers, are broken; and means for generating test patterns for application to the circuit, the test patterns being applied to the circuit in conjunction with partitioned clock signals each of which is associated with a corresponding portion of the circuit containing at least one of the self-loops.

21. An article of manufacture comprising a storage medium containing one or more software programs for use in testing a circuit comprising a plurality of registers, wherein the one or more software programs when executed by a processor implement the steps of:

configuring the circuit such that substantially all feedback loops associated with the registers, other than one or more self-loops each associated with a corresponding one of the registers, are broken; and generating test patterns for application to the circuit, the test patterns being applied to the circuit in conjunction with partitioned clock signals each of which is associated with a corresponding portion of the circuit containing at least one of the self-loops.

* * * * *